(12) United States Patent
Kostylev et al.

(10) Patent No.: US 7,786,462 B2
(45) Date of Patent: Aug. 31, 2010

(54) CHALCOGENIDE DEVICES EXHIBITING STABLE OPERATION FROM THE AS-FABRICATED STATE

(75) Inventors: Sergey A. Kostylev, Bloomfield Hills, MI (US); Tyler Lowrey, Southfield, MI (US); Guy Wicker, San Jose, CA (US); Wolodymyr Czubatyj, Warren, MI (US)

(73) Assignee: Ovonyx, Inc., Rochester Hills, MI (US)

( * ) Notice: Subject to any disclaimer, the term of this patent is extended or adjusted under 35 U.S.C. 154(b) by 123 days.

(21) Appl. No.: 11/975,615

(22) Filed: Oct. 19, 2007

(65) Prior Publication Data

US 2008/0048167 A1 Feb. 28, 2008

Related U.S. Application Data

(63) Continuation of application No. 11/200,466, filed on Aug. 9, 2005, now abandoned.

(51) Int. Cl.
*H01L 29/02* (2006.01)
*H01L 29/06* (2006.01)
*G11C 11/00* (2006.01)

(52) U.S. Cl. ............... 257/2; 257/3; 257/4; 257/5; 365/113; 365/163; 365/185.03; 365/185.12

(58) Field of Classification Search .......... 257/2, 257/3, 4, 5; 365/113, 163, 185.03, 185.12
See application file for complete search history.

(56) References Cited

U.S. PATENT DOCUMENTS 5,335,219 A * 8/1994 Ovshinsky et al. .......... 369/288
5,359,205 A * 10/1994 Ovshinsky .................. 257/3
5,687,112 A * 11/1997 Ovshinsky .................. 365/163
6,033,535 A * 3/2000 Ohno et al. ............. 204/192.2
6,141,241 A * 10/2000 Ovshinsky et al. .......... 365/163
6,671,710 B2 * 12/2003 Ovshinsky et al. .......... 708/493

* cited by examiner

*Primary Examiner*—Long K Tran
(74) *Attorney, Agent, or Firm*—Kevin L. Bray

(57) ABSTRACT

A chalcogenide material and chalcogenide memory device having less stringent requirements for formation, improved thermal stability and/or faster operation. The chalcogenide materials include materials comprising Ge, Sb and Te in which the Ge and/or Te content is lean relative to the commonly used $Ge_2Sb_2Te_5$ chalcogenide composition. Electrical devices containing the instant chalcogenide materials show a rapid convergence of the set resistance during cycles of setting and resetting the device from its as-fabricated state, thus leading to a reduced or eliminated need to subject the device to post-fabrication electrical formation prior to end-use operation. Improved thermal stability is manifested in terms of prolonged stability of the resistance of the device at elevated temperatures, which leads to an inhibition of thermally induced setting of the reset state in the device. Significant improvements in the 10 year data retention temperature are demonstrated. Faster device operation is achieved through an increased speed of crystallization, which acts to shorten the time required to transform the chalcogenide material from its reset state to its set state in an electrical memory device.

9 Claims, 12 Drawing Sheets

CHALCOGENIDE DEVICES EXHIBITING STABLE OPERATION FROM THE AS-FABRICATED STATE

CROSS-REFERENCE TO RELATED APPLICATIONS

This application is a continuation of and claims priority from U.S. patent application Ser. No. 11/200,466, entitled "Chalcogenide Devices Incorporating Chalcogenide Materials Having Reduced Germanium or Tellerium Content" and filed on Aug. 9, 2005, now abandoned the disclosure of which in its entirety is incorporated by reference herein.

FIELD OF INVENTION

This invention pertains to chalcogenide materials having applications as electrical and optical memories and switches. More particularly, this invention relates to chalcogenide materials showing high reproducibility of electrical resistance upon transformation from a primarily amorphous state to a primarily crystalline state on repeated cycles and to chalcogenide materials exhibiting high thermal stability. Most specifically, this invention is concerned with off-tieline chalcogenide alloys in the Ge—Sb—Te family having a low Ge concentration.

BACKGROUND OF THE INVENTION

Chalcogenide materials are an emerging class of commercial electronic materials that exhibit switching, memory, logic, and processing functionality. The basic principles of chalcogenide materials were developed by S. R. Ovshinsky in the 1960's and much effort by him and others around the world since then have led to advancements of the underlying science and an expansion of the field of application of chalcogenide materials.

Early work in chalcogenide devices demonstrated electrical switching behavior in which switching from a resistive state to a conductive state was induced upon application of a voltage at or above the threshold voltage of the active chalcogenide material. This effect is the basis of the Ovonic Threshold Switch (OTS) and remains an important practical feature of chalcogenide materials. The OTS provides highly reproducible switching at ultrafast switching speeds for over $10^{13}$ cycles. Basic principles and operational features of the OTS are presented, for example, in U.S. Pat. Nos. 3,271,591; 5,543,737; 5,694,146; and 5,757,446; the disclosures of which are hereby incorporated by reference, as well as in several journal articles including "Reversible Electrical Switching Phenomena in Disordered Structures", Physical Review Letters, vol. 1, p. 1450-1453 (1969) by S. R. Ovshinsky; "Amorphous Semiconductors for Switching, Memory, and Imaging Applications", IEEE Transactions on Electron Devices, vol. ED-20, p. 91-105 (1973) by S. R. Ovshinsky and H. Fritzsche; the disclosures of which are hereby incorporated by reference.

Another important application of chalcogenide materials is in electrical and optical memory devices. One type of chalcogenide memory device utilizes the wide range of resistance values available for the material as the basis of memory operation. Each resistance value corresponds to a distinct structural state of the chalcogenide material and one or more of the states can be selected and used to define operational memory states. Chalcogenide materials exhibit a crystalline state or phase as well as an amorphous state or phase. Different structural states of a chalcogenide material differ with respect to the relative proportions of crystalline and amorphous phase in a given volume or region of chalcogenide material. The range of resistance values is bounded by a set state and a reset state of the chalcogenide material. The set state is a low resistance structural state whose electrical properties are primarily controlled by the crystalline portion of the chalcogenide material and the reset state is a high resistance structural state whose electrical properties are primarily controlled by the amorphous portion of the chalcogenide material.

Each memory state of a chalcogenide memory material corresponds to a distinct resistance value and each memory resistance value signifies unique informational content. Operationally, the chalcogenide material can be programmed into a particular memory state by providing an electric current pulse of appropriate amplitude and duration to transform the chalcogenide material into the structural state having the desired resistance. By controlling the amount of energy provided to a chalcogenide material, it is possible to control the relative proportions of crystalline and amorphous phase regions within a volume of the material and to thereby control the structural (and memory) state of the chalcogenide material.

Each memory state can be programmed by providing the current pulse characteristic of the state and each state can be identified or read in a non-destructive fashion by measuring the resistance. Programming among the different states is fully reversible and the memory devices can be written and read over a virtually unlimited number of cycles to provide robust and reliable operation. The variable resistance memory functionality of chalcogenide materials is currently being exploited in the OUM (Ovonic Universal (or Unified) Memory) devices that are beginning to appear on the market. Basic principles and operation of OUM type devices are presented, for example, in U.S. Pat. Nos. 6,859,390; 6,774,387; 6,687,153; and 6,314,014; the disclosures of which are incorporated by reference herein as well as in several journal articles including "Low Field Amorphous State Resistance and Threshold Voltage Drift in Chalcogenide Materials", published in IEEE Transactions on Electron Devices, vol. 51, p. 714-719 (2004) by Pirovana et al.; and "Morphing Memory" published in IEEE Spectrum, vol. 167, p. 363-364 (2005) by Weiss.

The behavior (including switching, memory, and accumulation) and chemical compositions of chalcogenide materials included within the scope of this invention have been described, for example, in the following U.S. Pat. Nos. 6,671,710; 6,714,954; 6,087,674; 5,166,758; 5,296,716; 5,536,947; 5,596,522; 5,825,046; 5,687,112; 5,912,839; and 3,530,441, the disclosures of which are hereby incorporated by reference. These references also describe proposed mechanisms that govern the behavior of the chalcogenide materials. The references also describe the structural transformations from the crystalline state to the amorphous state (and vice versa) via a series of partially crystalline states in which the relative proportions of crystalline and amorphous regions vary underlying the operation of electrical and optical chalcogenide materials.

Current commercial development of the chalcogenide materials and devices is also oriented toward the fabrication of arrays of devices. Chalcogenide materials offer the promise of high density memory, logic and neural arrays that can operate according to traditional binary data storage or according to a multilevel scheme. Chalcogenide arrays further offer the prospect of integrating, on a single chip, both memory and processing capabilities, thereby enabling high speed operation.

In order to further expand the commercial prospects of chalcogenide phase change memories, it is necessary to consider improvements in both the chemical and physical properties of chalcogenide materials and in manufacturing processes. A current issue in terms of the properties of chalcogenide materials is the need to improve the thermal stability of the materials. Data in a chalcogenide material are retained as a structural state of the material, so any tendency of the structural state to transform with temperature represents a potential undesirable mechanism of erasing or losing data. Many chalcogenide memory materials retain their structural states for long periods of time at room temperature, but become susceptible to variations in the structural state upon increasing temperature. In practical terms, this limits the temperature environment in which chalcogenide memory devices can be utilized as well as the temperatures that can be employed in processing or manufacturing.

In most currently envisioned memory applications, chalcogenide materials are operated in a binary mode where the memory states correspond to, or approximately correspond to, the set state and the reset state since these states provide the greatest contrast in resistance and thus facilitate discrimination of the state of the material during read out. In most of the fabrication processes contemplated for commercial production of chalcogenide memory devices, the chalcogenide material is deposited on a substrate, electrical contact layer or other layer in an amorphous or otherwise disordered state and converted to a crystalline state during subsequent processing. In completed, fully fabricated devices, it is sometimes necessary to electrically form the chalcogenide material in a formation step to ready it for consistent operation as the active material of a memory element. The formation process includes the step of transforming the as-processed chalcogenide device to the optimum state for product use. In order to increase the efficiency of manufacturing, it is desirable to transform the chalcogenide material to the optimum state in a minimal number of pulses and have it ready for operation by the end-user. In practice, however, formation of the chalcogenide materials in current use requires many cycles of setting and resetting until the resistance of the set state stabilizes to a reproducible value.

SUMMARY OF THE INVENTION

The instant invention provides a chalcogenide alloy composition that, when used in electrical chalcogenide memory applications, provides for greater thermal stability and/or reduced need for or elimination of post-fabrication formation electrical stimulus and/or faster operation through shorter time-to-set characteristics.

The instant chalcogenide material includes Ge and Sb where the atomic concentration of Ge is less than or equal to 20% and the atomic concentration of Sb is greater than or equal to 30%. In a preferred embodiment, the atomic concentration of Ge is less than or equal to 16% and the atomic concentration of Sb is greater than or equal to 40%. In another preferred embodiment, the atomic concentration of Ge is less than or equal to 12% and the atomic concentration of Sb is greater than or equal to 50%.

In other preferred embodiments, instant chalcogenide material includes the foregoing atomic concentrations of Sb and an atomic concentration of Ge between 11% and 19%, more preferably between 13% and 18% and most preferably between 15% and 17%.

In still other preferred embodiments, the instant chalcogenide material includes Ge and Sb in the foregoing atomic concentration and further includes Te. In one embodiment, the atomic concentration of Te is less than or equal to 50% and more preferably between 20% and 50%. In another embodiment, the atomic concentration of Te is less than or equal to 40% and more preferably between 30% and 40%. In another embodiment, the atomic concentration of Te is less than or equal to 30%.

The instant invention includes electrical devices containing the instant chalcogenide materials where the devices include a layer of chalcogenide material in electrical communication with two electrical terminals or contacts. The instant invention further includes arrays of such devices.

In some embodiments, the number of electrical pulses required for the formation of devices that incorporate the instant chalcogenide alloys is reduced or eliminated. In one embodiment, formation of the device in its as-fabricated (virgin) state requires no more than one step of resetting the device and one step of setting the device. In a more preferred embodiment, no formation of the device in its as-fabricated (virgin) state is required.

In other embodiments, the set resistance of the device stabilizes in a fewer number of cycles of setting and resetting such that the variation in the set resistance from cycle-to-cycle is reduced. In one embodiment, the resistance of the first set state of the device differs from the resistance of the virgin state of the device by less than 50%. In a preferred embodiment, the resistance of the first set state of the device differs from the resistance of the virgin state of the device by less than 25%. In another preferred embodiment, the resistance of the second set state of the device differs from the resistance of the first set state of the device by less than 25%. In a more preferred embodiment, the resistance of the first set state of the device differs from the resistance of the virgin state of the device by less than 15%. In another more preferred embodiment, the resistance of the second set state of the device differs from the resistance of the first set state of the device by less than 15%.

In still other embodiments, the thermal stability of data retention is improved. In one embodiment, the instant alloy has a thermal stability sufficient to provide for 10 year data retention at a temperature of at least 120° C. In a preferred embodiment, the alloy has a thermal stability sufficient to provide for 10 year data retention at a temperature of at least 130° C. In a more preferred embodiment, the alloy has a thermal stability sufficient to provide for 10 year data retention at a temperature of at least 140° C.

In yet other embodiments, the speed of device operation is improved through a decrease in the the time required to set the device. In one embodiment, the time required to set a device including as an active layer a chalcogenide material according to the instant invention is less than or equal to 75% of the time required to set the same device when $Ge_{22.2}Sb_{22.2}Te_{55.5}$ is used as the active chalcogenide layer. In a preferred embodiment, the time required to set a device including as an active layer a chalcogenide material according to the instant invention is less than or equal to 50% of the time required to set the same device when $Ge_{22.2}Sb_{22.2}Te_{55.5}$ is used as the active chalcogenide layer. In a more preferred embodiment, the time required to set a device including as an active layer a chalcogenide material according to the instant invention is less than or equal to 30% of the time required to set the same device when $Ge_{22.2}Sb_{22.2}Te_{55.5}$ is used as the active chalcogenide layer.

DETAILED DESCRIPTION OF THE ILLUSTRATED EMBODIMENTS

Figure 1:
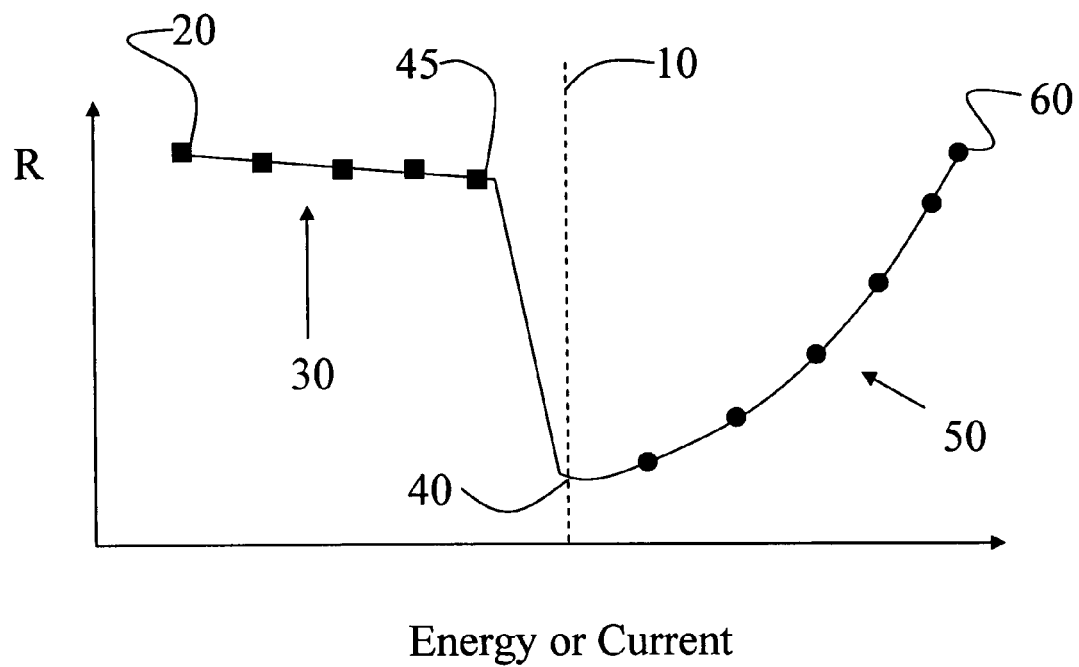
FIG. 1. Schematic depiction of the resistance of a chalcogenide material as a function of energy or current.

The instant invention provides chalcogenide materials having improved thermal stability and greater consistency of resistance characteristics during the conditioning cycles associated with the formation process of an as-deposited material that is completed prior to actual utilization of the material in a memory device. Since the underlying bases of these improvements are related to the structural characteristics of chalcogenide materials, it is helpful to review the basic principles of operation of chalcogenide materials.

An important feature of the chalcogenide materials in the operation of chalcogenide memory devices and device arrays is their ability to undergo a phase transformation between or among two or more structural states. (The importance of phase transformations in memory applications has prompted some people to refer to chalcogenide materials as phase change materials and they may be referred to herein as such.) The chalcogenide materials have structural states that include a crystalline state, one or more partially-crystalline states and an amorphous state. The crystalline state may be a single crystalline state or a polycrystalline state. As used herein, a partially-crystalline state refers to a structural state of a volume of chalcogenide material that includes an amorphous portion and a crystalline portion. Generally, a plurality of partially-crystalline states exists for the phase-change material that may be distinguished on the basis of the relative proportion of the amorphous and crystalline portions. Fractional crystallinity is one way to characterize the structural states of a chalcogenide phase-change material. The fractional crystallinity of the crystalline state is 100%, the fractional crystallinity of the amorphous state is 0%, and the partially-crystalline states have fractional crystallinities that vary continuously between 0% (the amorphous limit) and 100% (the crystalline limit). Phase-change chalcogenide materials are thus able to transform among a plurality of structural states that vary inclusively between fractional crystallinities of 0% and 100%.

Transformations among the structural states of a chalcogenide material are induced by providing energy to the chalcogenide material. Energy in various forms can influence the fractional crystallinity of a chalcogenide material and hence induce structural transformations. Suitable forms of energy include electrical energy, thermal energy, optical energy or other forms of energy (e.g. particle-beam energy) that induce electrical, thermal or optical effects in a chalcogenide material or combinations of the foregoing forms of energy. Continuous and reversible variability of the fractional crystallinity is achievable by controlling the energy environment of a chalcogenide material. A crystalline state can be transformed to a partially-crystalline or an amorphous state, a partially-crystalline state can be transformed to a crystalline or amorphous state, and an amorphous state can be transformed to a partially-crystalline or crystalline state through proper control of the energy environment of a chalcogenide material. Some considerations associated with the use of thermal, electrical and optical energy to induce structural transformations are presented in the following discussion.

The use of thermal energy to induce structural transformations exploits the thermodynamics and kinetics associated with the crystalline to amorphous or amorphous to crystalline phase transitions. An amorphous phase may be formed, for example, from a partially-crystalline or crystalline state by heating a chalcogenide material above its melting temperature and cooling at a rate sufficient to inhibit the formation of crystalline phases. A crystalline phase may be formed from an amorphous or partially-crystalline state, for example, by heating a chalcogenide material above the crystallization temperature for a sufficient period of time to effect nucleation and/or growth of crystalline domains. The crystallization temperature is below the melting temperature and corresponds to the minimum temperature at which crystallization may occur. The driving force for crystallization is typically thermodynamic in that the free energy of a crystalline or partially-crystalline state is lower than the free energy of an amorphous state so that the overall energy of a chalcogenide material decreases as the fractional crystallinity increases. Formation (nucleation and growth) of a crystalline state or crystalline domains within a partially-crystalline state is kinetically enabled, so that heating below the melting point promotes crystallization by providing energy that facilitates the rearrangements of atoms needed to form a crystalline phase or domain. The fractional crystallinity of a partially-crystalline state can be controlled by controlling the temperature or time of heating of the partially-crystalline state or by controlling the temperature or rate of cooling of an amorphous or partially-crystalline state.

The use of electrical energy to induce structural transformations relies on the application of electrical (current or voltage) pulses to a chalcogenide material. The mechanism of electrically induced structural transformations may be electronic in nature, possibly with an accompanying or consequent thermal contribution. By controlling the magnitude and/or duration of electrical pulses applied to a chalcogenide material, it is possible to vary continuously the fractional crystallinity. The influence of electrical energy on the structure of a chalcogenide material is frequently depicted in terms of the variation of the electrical resistance of a chalcogenide material with the amount of electrical energy provided or the magnitude of the current or voltage pulse applied to a chalcogenide material. A representative depiction of the electrical resistance (R) of a chalcogenide material as a function of electrical energy or current pulse magnitude (Energy/Current) is presented in FIG. 1 herein. FIG. 1 shows the variation of the electrical resistance of a chalcogenide material resulting from electrical energy or current pulses of various magnitude and may generally be referred to as a resistance plot.

The resistance plot includes two characteristic response regimes of a chalcogenide material to electrical energy. The regimes are approximately demarcated with the vertical dashed line 10 shown in FIG. 1. The regime to the left of the line 10 may be referred to as the accumulating regime of the chalcogenide material. The accumulation regime is distinguished by a nearly constant or gradually varying electrical resistance with increasing electrical energy that culminates in an abrupt decrease in resistance at and beyond a threshold energy. The accumulation regime thus extends, in the direction of increasing energy, from the leftmost point 20 of the resistance plot, through a plateau region (generally depicted by 30) corresponding to the range of points over which the resistance variation is small or gradual to the set point or state 40 that follows an abrupt decrease in electrical resistance. The plateau 30 may be horizontal or sloping. The left side of the resistance plot is referred to as the accumulating regime because the structural state of the chalcogenide material continuously evolves as energy is applied, with the fractional crystallinity of the structural state correlating with the total accumulation of applied energy. The leftmost point 20 corresponds to the structural state in the accumulating regime having the lowest fractional crystallinity and may be referred to as the reset state. This state may be fully amorphous or may contain some residual crystalline content. As energy is added, the fractional crystallinity increases, and the chalcogenide material transforms in the direction of increasing applied energy among a plurality of partially-crystalline states along the plateau 30. Selected accumulation states (structural states in the accumulation region) are marked with squares in FIG. 1. Upon accumulation of a threshold amount of applied energy, the fractional crystallinity of the chalcogenide material increases sufficiently to effect a setting transformation characterized by a dramatic decrease in electrical resistance and stabilization of the set state 40. The structural states in the accumulation regime may be referred to as accumulation states of the chalcogenide material. Structural transformations in the accumulating regime are unidirectional in the sense that they progress in the direction of increasing applied energy within the plateau region 30 and are reversible only by first driving the chalcogenide material through the set point 40 and resetting. The behavior illustrated in FIG. 1 is reproducible over many cycles of setting and resetting a device containing a chalcogenide material by applying the requisite energy or current. Once the reset state is obtained, lower amplitude current pulses can be applied and the accumulation response of the chalcogenide material can be retraced. It is thus possible to cycle between the set and reset states over multiple cycles, a necessary feature for long memory cycle life.

While not wishing to be bound by theory, the instant inventors believe that the addition of energy to a chalcogenide material in the accumulating regime leads to an increase in fractional crystallinity through the nucleation of new crystalline domains or growth of existing crystalline domains or a combination thereof. It is believed that the electrical resistance varies only gradually along the plateau 30 despite the increase in fractional crystallinity because the crystalline domains form or grow in relative isolation of each other so as to prevent the formation of a contiguous crystalline network that spans the chalcogenide material between the two device electrodes. This type of crystallization may be referred to as sub-percolation crystallization. The setting transformation coincides with a percolation threshold in which a contiguous, interconnected crystalline network forms within the chalcogenide material between the two device electrodes. Such a network may form, for example, when crystalline domains increase sufficiently in size to impinge upon neighboring domains. Since the crystalline phase of chalcogenide materials is more conductive and less resistive than the amorphous phase, the percolation threshold corresponds to the formation of a contiguous low resistance conductive pathway through the chalcogenide material. As a result, the percolation threshold is marked by a dramatic decrease in the resistance of the chalcogenide material. The leftmost point of the accumulation regime may be an amorphous state or a partially-crystalline state lacking a contiguous crystalline network. Sub-percolation crystallization commences with an initial amorphous or partially-crystalline state and progresses through a plurality of partially-crystalline states having increasingly higher fractional crystallinities until the percolation threshold is reached and the setting transformation occurs.

The regime to the right of the line 10 of FIG. 1 may be referred to as the grayscale regime or grayscale region. The grayscale regime extends from the set state 40 through a plurality of intermediate states (generally depicted by 50) to a reset point or state 60. The various points in the grayscale regime may be referred to as grayscale states of the chalcogenide material. Selected grayscale states are marked with circles in FIG. 1. Structural transformations in the grayscale regime may be induced by applying an electric current or voltage pulse to a chalcogenide material. In FIG. 1, an electric current pulse is indicated. In the grayscale regime, the resistance of the chalcogenide material varies with the magnitude of the applied electric pulse. The resistance of a particular state in the grayscale regime is characteristic of the structural state of the chalcogenide material, and the structural state of a chalcogenide material is dictated by the magnitude of the current pulse applied in the grayscale region. The fractional crystallinity of the chalcogenide material decreases as the magnitude of the current pulse increases. The fractional crystallinity is highest for grayscale states at or near the set point 40 and progressively decreases as the reset state 60 is approached. The chalcogenide material transforms from a structural state possessing a contiguous crystalline network at the set state 40 to a structural state that is amorphous or substantially amorphous or partially-crystalline without a contiguous crystalline network at the reset state 60. The application of current pulses having increasing magnitude has the effect of converting portions of the crystalline network into an amorphous phase and ultimately leads to a disruption or interruption of contiguous high-conductivity crystalline pathways in the chalcogenide material. As a result, the resistance of the chalcogenide material increases as the magnitude of an applied current pulse increases in the grayscale region.

In contrast to the accumulating region, structural transformations that occur in the grayscale region are reversible, bi-directional, and this region may thus also be referred to as the direct overwrite region of the resistance plot. As indicated hereinabove, each state in the grayscale region may be identified by its resistance and a current pulse magnitude, where application of that current pulse magnitude induces changes in fractional crystallinity that produce the particular resistance value of the state. Application of a subsequent current pulse may increase or decrease the fractional crystallinity relative to the fractional crystallinity of the initial state of the chalcogenide material. If the subsequent current pulse has a higher magnitude than the pulse used to establish the initial state, the fractional crystallinity of the chalcogenide material decreases and the structural state is transformed from the initial state in the direction of the reset state along the greyscale resistance curve. Similarly, if the subsequent current pulse has a lower magnitude than the pulse used to establish the initial state, the fractional crystallinity of the chalcogenide material increases and the structural state is transformed from the initial state in the direction of the set state along the grayscale resistance curve.

In OUM (Ovonic Unified (or Universal) Memory) applications, the greyscale states of the chalcogenide material are used to define memory states of a memory device. Most commonly, the memory devices are binary memory devices that utilize two of the greyscale states as memory states, where a distinct information value (e.g. "0" or "1") is associated with each state. Each memory state thus corresponds to a distinct structural state of the chalcogenide material and readout or identification of the state can be accomplished by measuring the resistance of the material (or device) since each structural state is characterized by a distinct resistance value as exemplified, for example, by the greyscale states in FIG. 1. The operation of transforming a chalcogenide material to the structural state associated with a particular memory state may be referred to herein as programming the chalcogenide material or writing to the chalcogenide material or storing information in the chalcogenide material.

To facilitate readout and to minimize readout error, it is desirable to select the memory states of a binary memory device so that the contrast in resistance of the two states is large. Typically the set state (or a state near the set state) and the reset state (or a state near the reset state) are selected as memory states in a binary memory application. The resistance contrast depends on details such as the chemical composition of the chalcogenide, the thickness of the chalcogenide material in the device and the geometry of the device. For a layer of phase-change material having the composition $Ge_{22}Sb_{22}Te_{56}$, a thickness of ~600 Å, and pore diameter of below ~0.1 µm in a typical two-terminal device structure, for example, the resistance of the reset state is ~100-1000 k$\Omega$ and the resistance of the set state is under ~10 k$\Omega$. Phase-change materials in general show resistances in the range of ~100 k$\Omega$ to ~1000 k$\Omega$ in the reset state and resistance of ~0.5 k$\Omega$ to ~50 k$\Omega$ in the set state. In the preferred phase-change materials, the resistance of the reset state is at least a factor of two, and more typically an order of magnitude or more, greater than the resistance of the set state. In addition to binary (single bit) memory applications, chalcogenide materials may be utilized as non-binary or multiple bit memory materials by selecting three or more states from among the greyscale states and associating an information value with each state, where each memory state corresponds to a distinct structural state of the chalcogenide and is characterized by a distinct resistance value.

One embodiment of the instant invention provides chalcogenide materials having improved thermal stability. The improved thermal stability is manifested as a prolongation of the retention of the structural states associated with the memory states of the chalcogenide upon increasing temperature. As described hereinabove, the application of energy, including thermal energy, may lead to an alteration of the structural state of a volume of chalcogenide material through a variation in the relative proportions and/or arrangement of crystalline and amorphous phase regions contained within the volume. As the structural state varies, the resistance of the material changes and no longer corresponds to the value programmed into the material during the storage operation. If the deviation is sufficiently large, it may not be possible to discern which state the material was programmed into and as a result, the original information stored into the material is lost and the memory is unreliable. Since reliable operation of chalcogenide memory devices at elevated temperatures is necessary for many applications, it is desirable to develop chalcogenide materials that resist structural modifications in high temperature environments. Furthermore, in device fabrication, it is necessary to deposit ancillary layers (e.g. electrode layers, insulating layers, barrier layers etc.) on top of a chalcogenide layer and the thermal stability of the chalcogenide imposes limits on the deposition and other processing conditions associated with providing such layers.

Another embodiment of the instant invention provides chalcogenide materials capable of undergoing more efficient formation of the as-processed material or device. As used herein, as-processed material and device refer to the state or properties of the chalcogenide material or the device containing the chalcogenide material following fabrication and prior to any post-fabrication electrical treatment. Formation is a post-fabrication electrical conditioning process that is used to prepare an as-processed material or device for use as a memory (or threshold switching) material or device.

As indicated hereinabove, typically the set and reset states are selected as the memory states of a binary memory device. In order for memory operation to be reliable, it is necessary for the resistance values of the set and reset states to be reproducible over the multiple cycles of setting and resetting associated with the writing (storing), erasing and rewriting of information over the life of the memory device. It is further desirable for the device, in the as-processed state, to exhibit resistance values corresponding to those to be used in actual application.

In prior art chalcogenide memory devices, the resistances of the set and/or reset states of the device in the as-processed state frequently deviate from the values used in the ultimate application of the device. More specifically, when electrical energy or pulses is used to transform the device between the set and reset states, the resistances values vary from cycle-to-cycle over several cycles until they stabilize to the values that will be used in actual operation. The formation process is a post-fabrication electrical stimulus that is used to condition an as-processed device to the state in which it will operate in actual application. In the formation process, the as-processed device is conditioned by cycling it through the set and reset states for a sufficient number of conditioning cycles to reach stable resistances values for those states.

The instant devices include a chalcogenide alloy that greatly facilitates the formation process by reducing the number of conditioning cycles needed to achieve stable values of relevant operating parameters such as resistances of memory states (e.g. set state and reset state as well as other selected memory states if desired) and the threshold switching voltage for the reset state. In one embodiment, formation is accomplished in no more than three conditioning cycles. In a preferred embodiment, formation is accomplished in no more than two conditioning cycles. In a more preferred embodiment, formation is accomplished in no more than one conditioning cycle. In a most preferred embodiment, no formation is needed and the device as-processed is ready for operation.

The chalcogenide materials used in the instant devices include alloys of germanium (Ge), antimony (Sb) and tellurium (Te) where the Ge and/or Te concentration is lean relative to the conventional $Ge_2Sb_2Te_5$ composition of the prior art. While not wishing to be bound by theory, the instant inventors believe that compositions lean in Ge or Te are beneficial because they have a tendency to reduce, minimize or potentially eliminate oxidation of the chalcogenide material and/or oxidation of the interface between the chalcogenide material and either or both of the top and bottom electrodes in the device structure. It is postulated that Ge has a tendency to getter oxygen during device fabrication, potentially incorporating oxygen and/or forming one or more germanium oxide phases or layers that must be broken down, removed or rendered harmless during the electrical formation process in order to stabilize the operational characteristics of the device. The presence of a germanium oxide phase or component in the chalcogenide material or at an electrode interface with the chalcogenide material leads to an increase in the resistance measured between the top and bottom electrodes of the as-formed device since oxide phases are generally resistive. In this view, the formation is a process in which undesired oxide phases are broken down or redistributed within the active volume of chalcogenide material to provide a more homogenous chalcogenide region and thus more consistent and reproducible operation. By decreasing the Ge concentration in the chalcogenide alloy, it is believed that less oxygen may become incorporated and as a result, that less or no formation or conditioning is needed to ready the as-processed device for practical application.

While not wishing to be bound by theory, the instant inventors further hypothesize that other factors may also contribute to or even dominate the behavior of the instant chalcogenide materials when used as active materials in an electrical memory device. Compositions that contain a high Ge concentration are believed to promote phase segregation of the chalcogenide material during fabrication, annealing and/or deposition. There may be two consequences of the tendency of a chalcogenide material to phase segregate when the Ge concentration is high. First, the as-fabricated device may include a chalcogenide material that may not be homogeneous, but rather may contain a combination of Ge-rich and Sb/Te-rich phases. If so, the formation process may lead to a homogenization of the phases through melting and recrystallizing to produce a chalcogenide material that exhibits stable, uniform and reproducible properties.

Second, if processing and fabrication are controlled to permit formation of a uniform chalcogenide material in the as-fabricated device, subsequent operation of the device through cycling between the set and reset states may induce phase segregation to produce a Ge-rich phase and a Ge-lean phase in the chalcogenide layer. Such an effect may occur if the chalcogenide composition melts incongruently. During operation of the chalcogenide memory device, there may exist a temperature gradient between the top and bottom electrodes. In many common device designs, the bottom electrode is believed to become hotter than the top electrode, resulting in a temperature gradient that provides a differential melting effect of the volume of chalcogenide material. Material near the bottom electrode may become hotter, melt more efficiently and show a greater tendency to phase segregate during operation. After a certain number of cycles, an equilibrium point may be reached in which an equilibrium amount of Ge is phase segregated. Once an equilibrium amount of Ge is segregated, it may further be subject to electromigration (perhaps toward the bottom electrode) in the presence of the voltages applied during operation of the device. If so, the formation process may correspond to the process of phase segregating of an equilibrium amount of Ge along with electromigration of the phase-segregated Ge to an equilibrium position within the pore of the device. Upon conclusion of formation, the chalcogenide has reached a stable, reproducible state.

In one embodiment, the alloy is a Ge—Sb—Te material having a Ge concentration of 11%-19%. In a preferred embodiment, the alloy is a Ge—Sb—Te material having a Ge concentration of 13%-18%. In a more preferred embodiment, the alloy is a Ge—Sb—Te material having a Ge concentration of 15%-17%.

EXAMPLE 1

In this example, the fabrication of memory devices having active chalcogenide layers in accordance with the instant invention is described. The device structure is a commonly utilized two-terminal device design having an active chalcogenide layer in a pore geometry in electrical contact with top and bottom electrodes. Two different device configurations were used and similar results were achieved for each. Both designs were deposited on an Si wafer with a thick $SiO_2$ surface oxide layer.

In one design, a tungsten layer was deposited on the surface oxide and another $SiO_2$ layer was deposited thereon. A 600 Å diameter opening was formed in the deposited $SiO_2$ layer and was filled with TiN. The tungsten layer and TiN layers serves as a bottom electrode. A chalcogenide layer having a thickness of 500 Å was deposited on the TiN filled opening and surrounding $SiO_2$ layers. A top electrode was next deposited in situ and included a 400 Å carbon layer deposited on top of the chalcogenide layer and one or more conductive layers deposited on top of the carbon layer. The conductive layers typically included a 300 Å TiN layer and a 500 Å Ti layer.

In a second design, a 350 Å bottom electrode layer (e.g. titanium aluminum nitride) was deposited on the surface oxide layer and an insulating layer (e.g. $SiO_2$) was deposited on the bottom electrode. A pore having a diameter of approximately 800 Å was formed in the insulating layer. A chalcogenide layer having a thickness of 500 Å was then deposited. The chalcogenide layer coated the pore and extended laterally over the surrounding insulating layer. A top electrode was next in situ deposited and included a 400 Å carbon layer deposited on top of the chalcogenide layer and one or more conductive layers deposited on top of the carbon layer. The conductive layers typically included a 300 Å TiN layer and a 500 Å Ti layer.

Appropriate lithography and patterning was performed on each device design to permit addressing of the devices and the devices were subjected to annealing at 300° C. for 30 minutes. Both device designs are well-known in the art and further information about chalcogenide phase change memory cells can be found in, for example, U.S. Pat. Nos. 5,166,758; 5,296,716; 5,414,271; 5,359,205; and 5,534,712; the disclosures of which are hereby incorporated by reference.

The chalcogenide layer of each memory device of this EXAMPLE was deposited at 200° C. using an RF co-sputtering process. Targets of $Ge_2Sb_2Te_5$, Ge, Sb and Te were used in the deposition. By controlling the power, ion energetics, time of exposure and utilization of the different targets in the sputtering process, chalcogenide films of different composition were prepared. Memory devices having chalcogenide layers with the following compositions were fabricated:

| Chalcogenide Material | Ge (at. %) | Sb (at. %) | Te (at. %) | Ge:Sb:Te Ratio |
|---|---|---|---|---|
| $Ge_{0.07}Sb_{0.77}Te_{0.17}$ | 7 | 77 | 17 | 1:10:2 |
| $Ge_{0.09}Sb_{0.69}Te_{0.22}$ | 9 | 69 | 22 | 1:7:2 |
| $Ge_{11.1}Sb_{61.1}Te_{27.8}$ | 11.1 | 61.1 | 27.8 | 1:6:3 |
| $Ge_{13.5}Sb_{53}Te_{33.5}$ | 13.5 | 53 | 33.5 | 3:12:8 |
| $Ge_{15.5}Sb_{45.5}Te_{38.9}$ | 15.5 | 45.5 | 38.9 | 2:5:4 |
| $Ge_{17.8}Sb_{37.8}Te_{44.4}$ | 17.8 | 37.8 | 44.4 | 2:4:5 |
| $Ge_{20}Sb_{30}Te_{50}$ | 20.0 | 30.0 | 50.0 | 2:3:5 |
| $Ge_{20}Sb_{65}Te_{15}$ | 20 | 65 | 15 | 4:13:3 |
| $Ge_{22.2}Sb_{22.2}Te_{55.5}$ | 22.2 | 22.2 | 55.5 | 2:2:5 |
| $Ge_{25}Sb_{25}Te_{50}$ | 25.0 | 25.0 | 50.0 | 2:2:4 |
| $Ge_{25}Sb_{40}Te_{35}$ | 25.0 | 40.0 | 35.0 | 5:8:7 |
| $Ge_{25}Sb_{45}Te_{30}$ | 25.0 | 45.0 | 30.0 | 5:9:6 |
| $Ge_{25}Sb_{50}Te_{25}$ | 25.0 | 50.0 | 25.0 | 1:2:1 |
| $Ge_{30.5}Sb_{30.5}Te_{38.9}$ | 30.5 | 30.5 | 38.9 | 4:4:5 |
| $Ge_{31}Sb_{54}Te_{15}$ | 31 | 54 | 15 | 6:11:3 |
| $Ge_{36.1}Sb_{36.1}Te_{27.8}$ | 36.1 | 36.1 | 27.8 | 4:4:3 |
| $Ge_{37.8}Sb_{17.8}Te_{44.4}$ | 37.8 | 17.8 | 44.4 | 4:2:5 |
| $Ge_{42}Sb_{43}Te_{15}$ | 42 | 43 | 15 | 3:3:1 |
| $Ge_{45.5}Sb_{15.5}Te_{38.9}$ | 45.5 | 15.5 | 38.9 | 6:2:5 |
| $Ge_{61.1}Sb_{11.1}Te_{27.8}$ | 61.1 | 11.1 | 27.8 | 6:1:3 | where compositions are listed in atomic percentages of the elements included in the chalcogenide layer of each device. The atomic percentages may also be referred to herein as the atomic concentration. The Ge:Sb:Te ratio is approximate and corresponds to the approximate chemical stoichiometry of the chalcogenide layer. Many devices using each of the chalcogenide compositions were fabricated for this example.

EXAMPLE 2

In this example, the improved formation characteristics of devices according to the instant invention are described. As described hereinabove, formation is a process that involves the post-fabrication electrical conditioning of a device to prepare it for its end application. Formation is required for the currently available chalcogenide memory devices and requires a series of electrical conditioning cycles that include setting and resetting the device until stable resistances are achieved for the set and reset states. In this example, we demonstrate the ability of devices using the instant chalcogenide materials to reduce or eliminate the need for formation. The devices used in this example correspond to those described in EXAMPLE 1 hereinabove. Devices included selected chalcogenide compositions from those presented in EXAMPLE 1 are described.

To evaluate the formation requirements of a device, we measured the resistance of the device in its as-fabricated state and subjected it to multiple cycles of setting and resetting to assess whether and to what extent the set state resistance varies on cycling. The resistance of the as-fabricated device was measured after fabrication and before any attempt to set or reset the device through electrical means was made. The resistance of the as-fabricated device may be referred to herein as the virgin resistance of the device or, alternatively, as the resistance of the virgin state of the device. After measurement of the virgin resistance, the device was cycled through its set and reset states. The cycling entailed measurements of the R-I (resistance-current) characteristics of the device using standard procedures. A series of voltage pulses was applied between the top and bottom electrodes of the device and the device pulse current and post-pulse low voltage (0.4 V) resistance were measured in response to each pulse. The series of pulses began with a 0.2V pulse and continued with pulses with amplitudes increasing in 0.2V increments up to a maximum pulse voltage of 7V. The pulse current and resulting low voltage (0.4 V) resistance measured for each pulse were plotted to form an R-I curve and from the R-I curve, the set resistance and reset resistance of the device were obtained. The process was repeated over several cycles until the set resistance stabilized. R-I measurements were made on four different devices for each of the chalcogenide compositions measured.

Representative results from the R-I measurements are shown in FIGS. 2-5 for devices that include $Ge_{37.8}Sb_{17.8}Te_{44.4}$ ($Ge_4Sb_2Te_5$), $Ge_{22.2}Sb_{22.2}Te_{55.5}$ ($Ge_2Sb_2Te_5$), $Ge_{17.8}Sb_{37.8}Te_{44.4}$ ($Ge_2Sb_4Te_5$) and $Ge_{11.1}Sb_{61.1}Te_{27.8}$ ($GeSb_6Te_3$), respectively, as the active chalcogenide material. In each of FIGS. 2-5, the data points depicted as diamonds correspond to the R-I curve that began with the device in its as-fabricated state. The leftmost data point of the diamond data set corresponds to the virgin resistance of the device. Voltages of increasing amplitude are subsequently applied as described hereinabove to produce the other data points in the diamond set. Higher pulse amplitudes correspond to higher currents. The minimum resistance resulting from application of the voltage pulses corresponds to the resistance of the set state. The diamond data set shows an increase in resistance at the high end of applied pulse amplitudes. As described hereinabove, the resistance increase marks the transition to the reset state. Upon reaching the reset state, the measurement is stopped and the experiment is repeated to cycle once again through the set state and reset state of the device.

Figure 2:
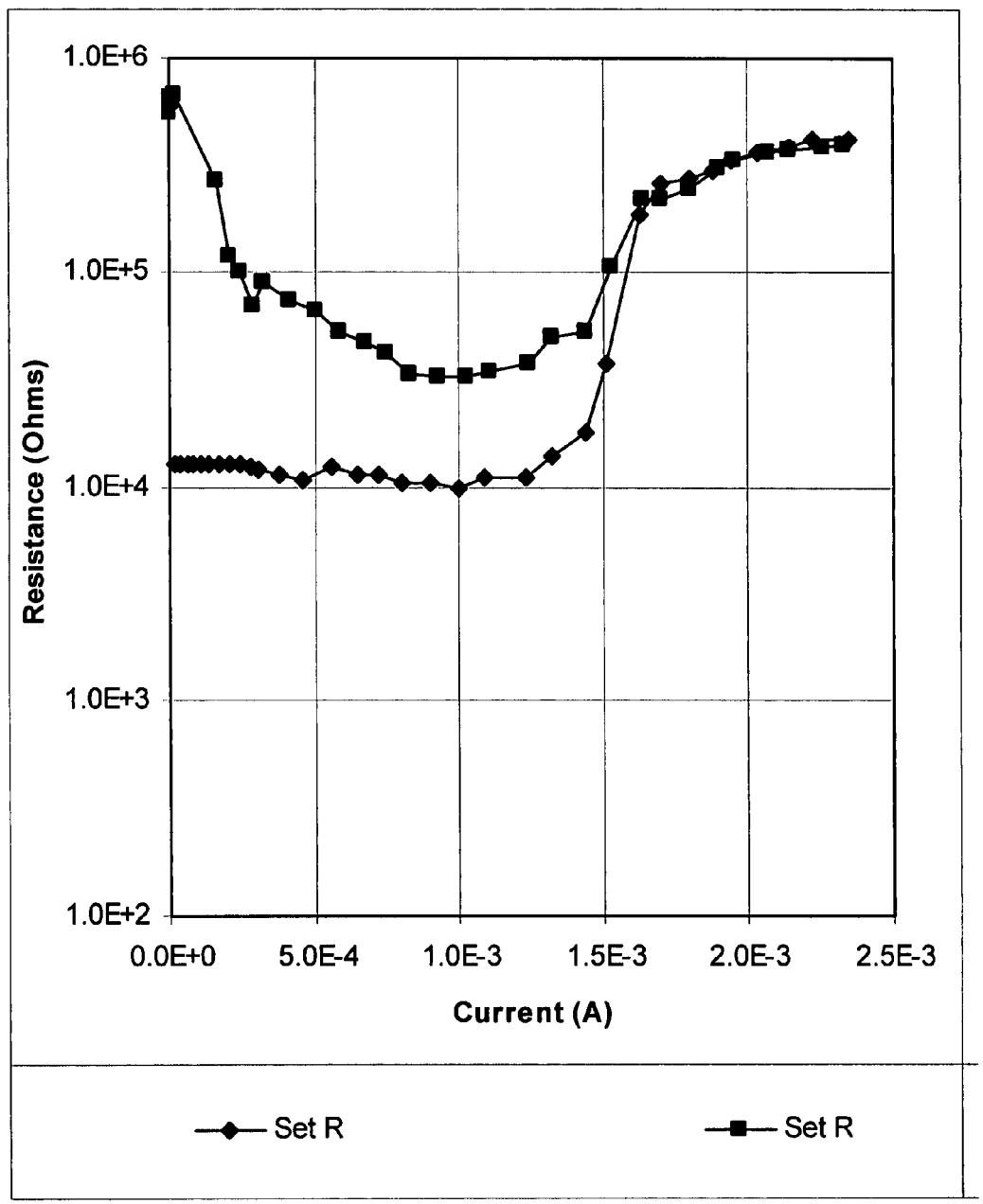
FIG. 2. R-I curve of a device that includes $Ge_{37.8}Sb_{17.8}Te_{44.4}$ ($Ge_4Sb_2Te_5$) as the active chalcogenide material.

FIG. 2 shows a comparison of two cycles of a device including $Ge_4Sb_2Te_5$ as the active material. The cycle beginning with the as-fabricated device is the lower set of data points (diamonds) and the other data set (squares) corresponds to the cycle obtained following attainment of the reset state of the as-fabricated device. FIG. 2 shows a marked difference in the resistance of the set state for the two cycles and this difference demonstrates the need to form a device based on $Ge_4Sb_2Te_5$.

Figure 3:
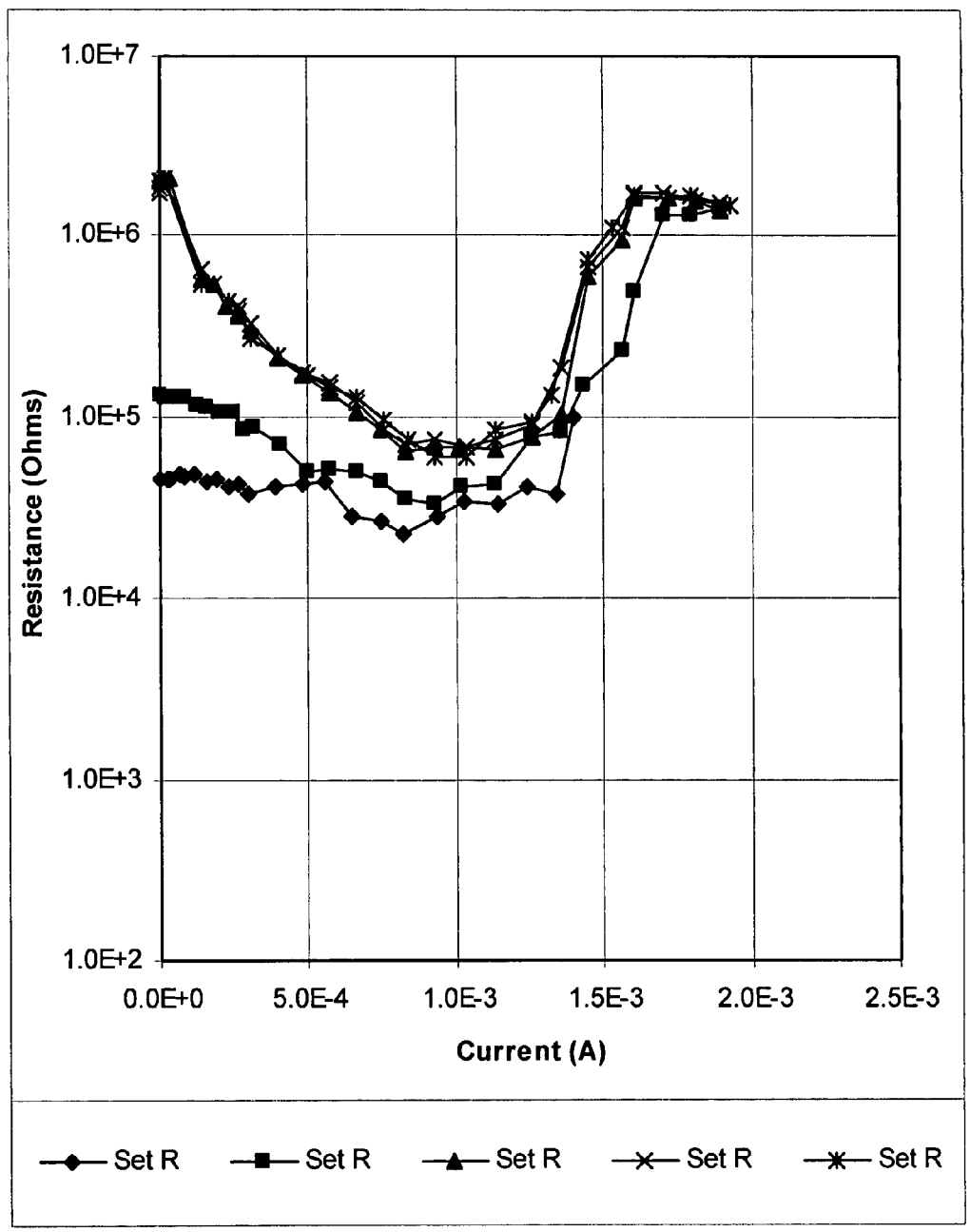
FIG. 3. R-I curve of a device that includes $Ge_{22.2}Sb_{22.2}Te_{55.5}$ ($Ge_2Sb_2Te_5$) as the active chalcogenide material.

FIG. 3 shows a comparison of five cycles of a device including $Ge_2Sb_2Te_5$ as the active material. The cycle beginning with the as-fabricated device is the lower set of data points (diamonds). The data points indicated with squares correspond to the next cycle, which is the cycle that begins after the as-fabricated device has been once transformed to the reset state. Data for an additional three cycles are also shown. FIG. 3 indicates that the resistance of the set state varies over the first three cycles and then stabilizes. The device including $Ge_2Sb_2Te_5$ thus requires formation before a stable set state resistance is achieved and the data show a significant difference in the set resistance observed upon setting the virgin state and the stabilized resistance of the set state after formation.

Figure 4:
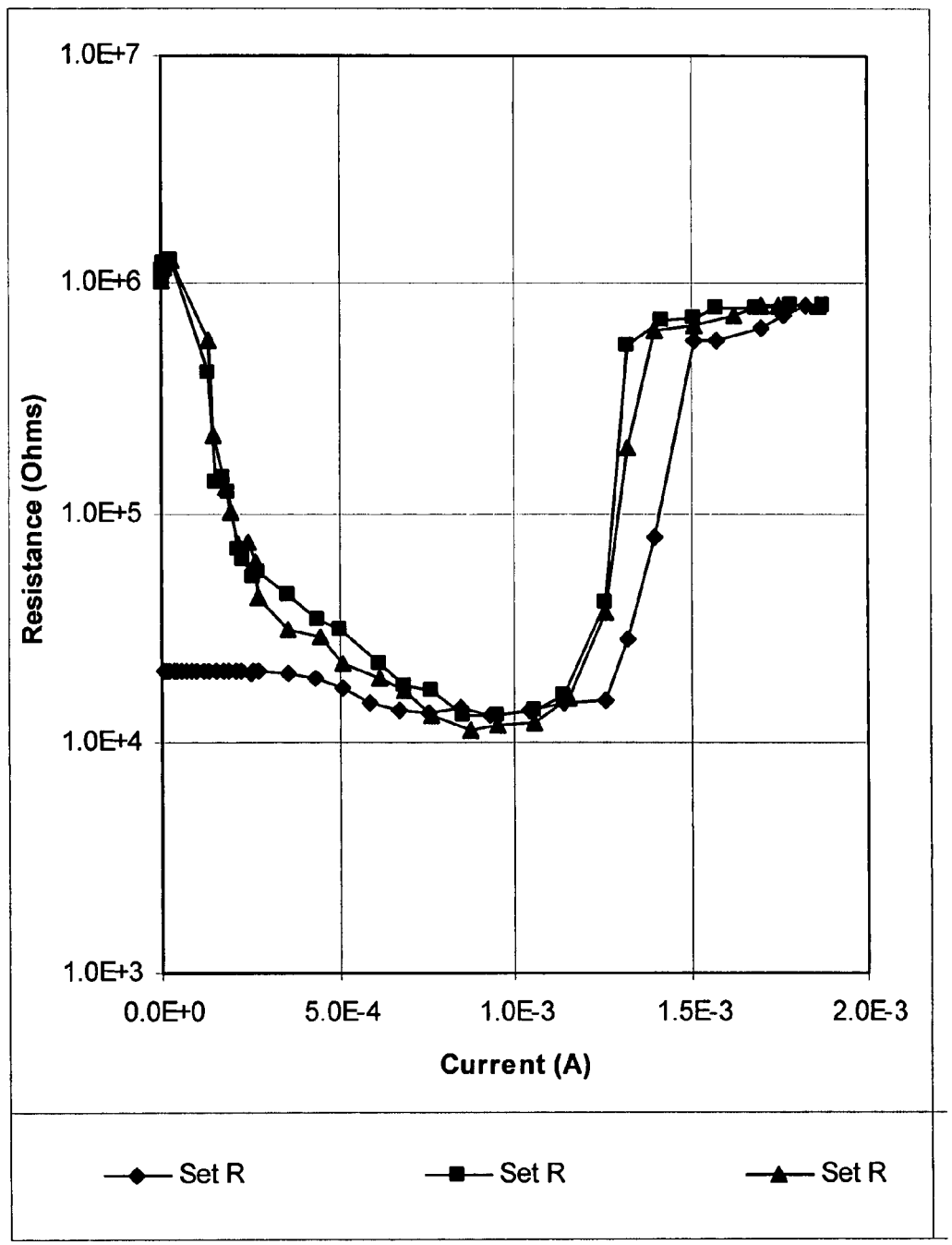
FIG. 4. R-I curve of a device that includes $Ge_{17.8}Sb_{37.8}Te_{44.4}$ ($Ge_2Sb_4Te_5$) as the active chalcogenide material.

FIG. 4 shows a comparison of three cycles of a device including $Ge_2Sb_4Te_5$ as the active material. The cycle beginning with the as-fabricated device is the lower set of data points (diamonds). The data points indicated with squares correspond to the next cycle, which is the cycle that begins after the as-fabricated device has been once transformed to the reset state. The data points indicated with triangles correspond to the next cycle, which is the cycle that begins after the as-fabricated device has been twice transformed to the reset state. For this chalcogenide composition, the resistance of the set state varies only slightly upon cycling and the resistance of the set state obtained upon setting the virgin state corresponds closely with the resistance of the set state obtained in later cycles. The data of FIG. 4 indicate that a device that includes $Ge_2Sb_4Te_5$ as the active chalcogenide material requires essentially no formation and is ready for use in its finally application in the as-fabricated state.

Figure 5:
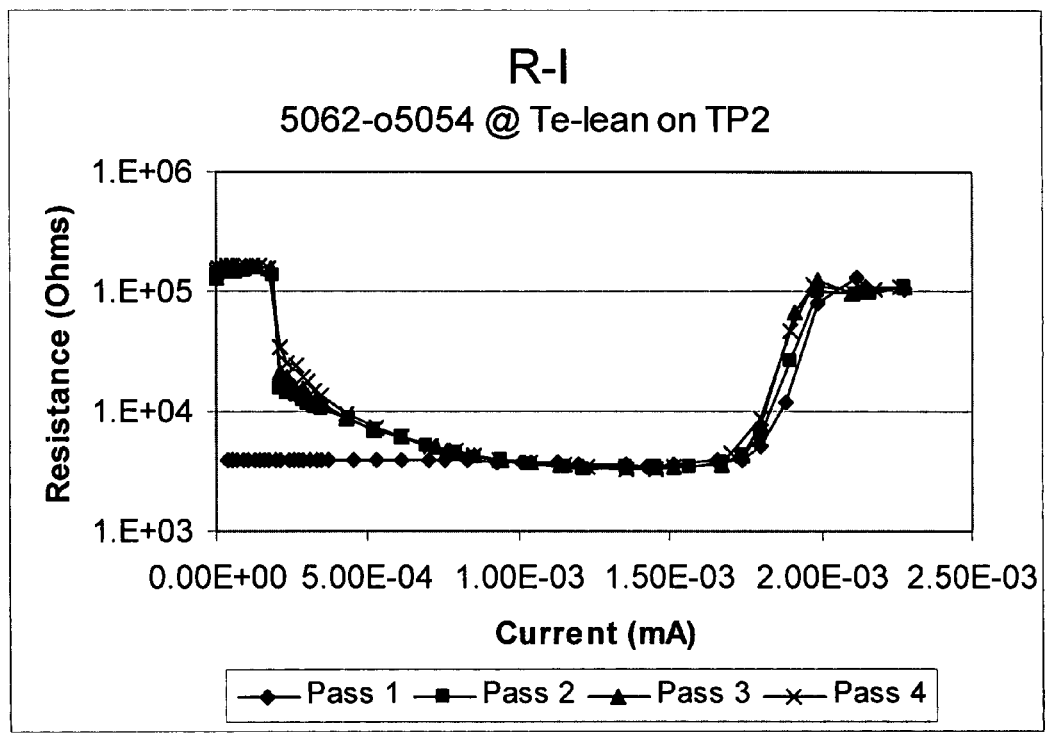
FIG. 5. R-I curve of a device that includes $Ge_{11.1}Sb_{61.1}Te_{27.8}$ ($GeSb_6Te_3$) as the active chalcogenide material.

FIG. 5 shows a comparison of four cycles of a device including GeSb$_6$Te$_3$ as the active material. The cycle beginning with the as-fabricated device is the lower set of data points (diamonds). The data points indicated with squares correspond to the next cycle, which is the cycle that begins after the as-fabricated device has been once transformed to the reset state. The data points indicated with triangles correspond to the next cycle, which is the cycle that begins after the as-fabricated device has been twice transformed to the reset state. The data points indicated with crosses correspond to the next cycle, which is the cycle that begins after the as-fabricated device has been transformed to the reset state three times. For this chalcogenide composition, the resistance of the set state varies only slightly upon cycling and the resistance of the set state obtained upon setting the virgin state corresponds closely with the resistance of the set state obtained in later cycles. The data of FIG. 5 indicate that a device that includes GeSb$_6$Te$_3$ as the active chalcogenide material requires essentially no formation and is ready for use in its finally application in the as-fabricated state.

The set state resistances of devices including selected of the instant chalcogenide compositions as the active material are summarized in FIGS. 6-11. For each of the selected illustrative chalcogenide compositions, the set resistances of four separate devices is illustrated. Common terminology is used in each of the figures. Rvirgin refers to the resistance of the virgin state of the device and may be referred to herein as the virgin resistance of the device. Rset0 refers to the resistance of the set state obtained upon setting the virgin state of the device (without a prior reset) and may be referred to herein as the resistance of the first set state of the device. Rset1 refers to the resistance of the set state obtained after the device has been reset one time and may be referred to herein as the resistance of the second set state of the device. Rset2 refers to the resistance of the set state obtained after the device has been reset two times and may be referred to herein as the resistance of the third set state of the device. Rset3 refers to the resistance of the set state obtained after the device has been reset three times and may be referred to herein as the resistance of the fourth set state of the device. Four results are shown for each of Rvirgin, Rset0, Rset1, Rset2, and Rset3 in FIGS. 6-11 to indicate the results for different devices utilizing each of the selected illustrative chalcogenide materials. The different devices were selected from different portions of the wafer. The data are presented in the form of bar graphs where the bar graphs of the different set states (Rset0, Rset1, Rset2, and Rset3) for a particular device containing each of the chalcogenide materials are depicted in a common greyscale shade. The bar graph shows the resistance of the set state for the four devices over the initial few cycles of setting and resetting the device. Resistances of the first set state, second set state, third set state and fourth set state are shown. The bar graphs illustrate the extent to which devices based on each of the selected illustrative chalcogenide materials require formation.

Figure 6:
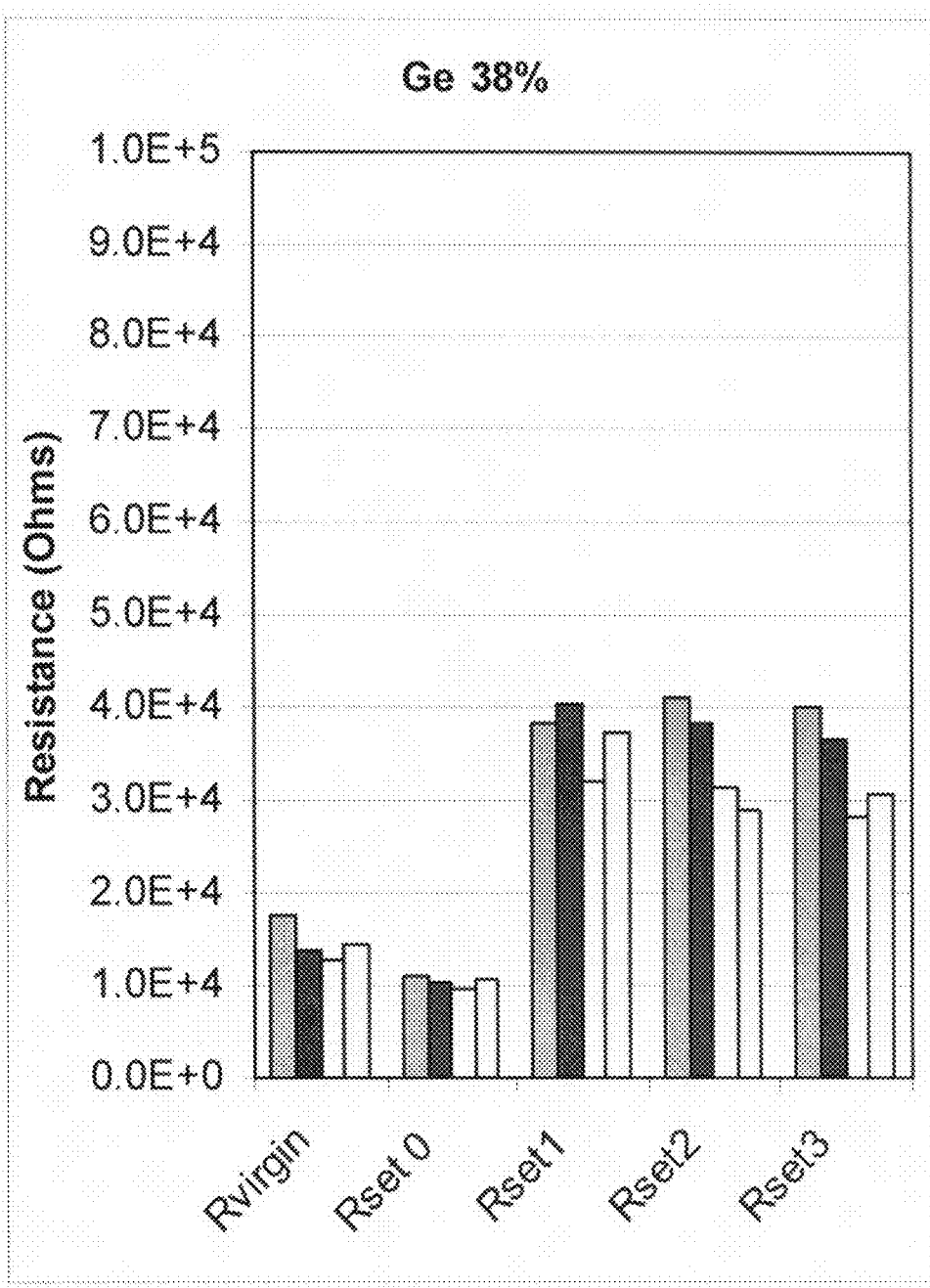
FIG. 6. Virgin resistance and set resistance upon cycling of a device that that includes $Ge_{37.8}Sb_{17.8}Te_{44.4}$ ($Ge_4Sb_2Te_5$) as the active chalcogenide material.

FIG. 6 shows the results for the device that includes Ge$_{37.8}$Sb$_{17.8}$Te$_{44.4}$ (approximate composition: Ge$_4$Sb$_2$Te$_5$) as the active chalcogenide material. This material includes 37.8% Ge, 17.8% Sb, and 44.4% Te. The results indicate that the set resistance Rset0 of the virgin state is lower than the virgin resistance and that the set resistance Rset1 following the first reset is much higher than either the virgin resistance or Rset0. Set resistances Rset2 and Rset3 following subsequent set-reset cycles are similar to Rset1 for the devices. FIG. 6 indicates that stabilization of the set resistance of the device requires a formation process that includes at least one step in which the device is set and at least one step in which the device is reset. An as-fabricated device that includes Ge$_{37.8}$S$_{17.8}$Te$_{44.4}$ as the active chalcogenide material is not ready for use in its intended memory application since the stabilized set resistance deviates significantly from the virgin resistance and since conditioning of the device is needed to stabilize its performance.

Figure 7:
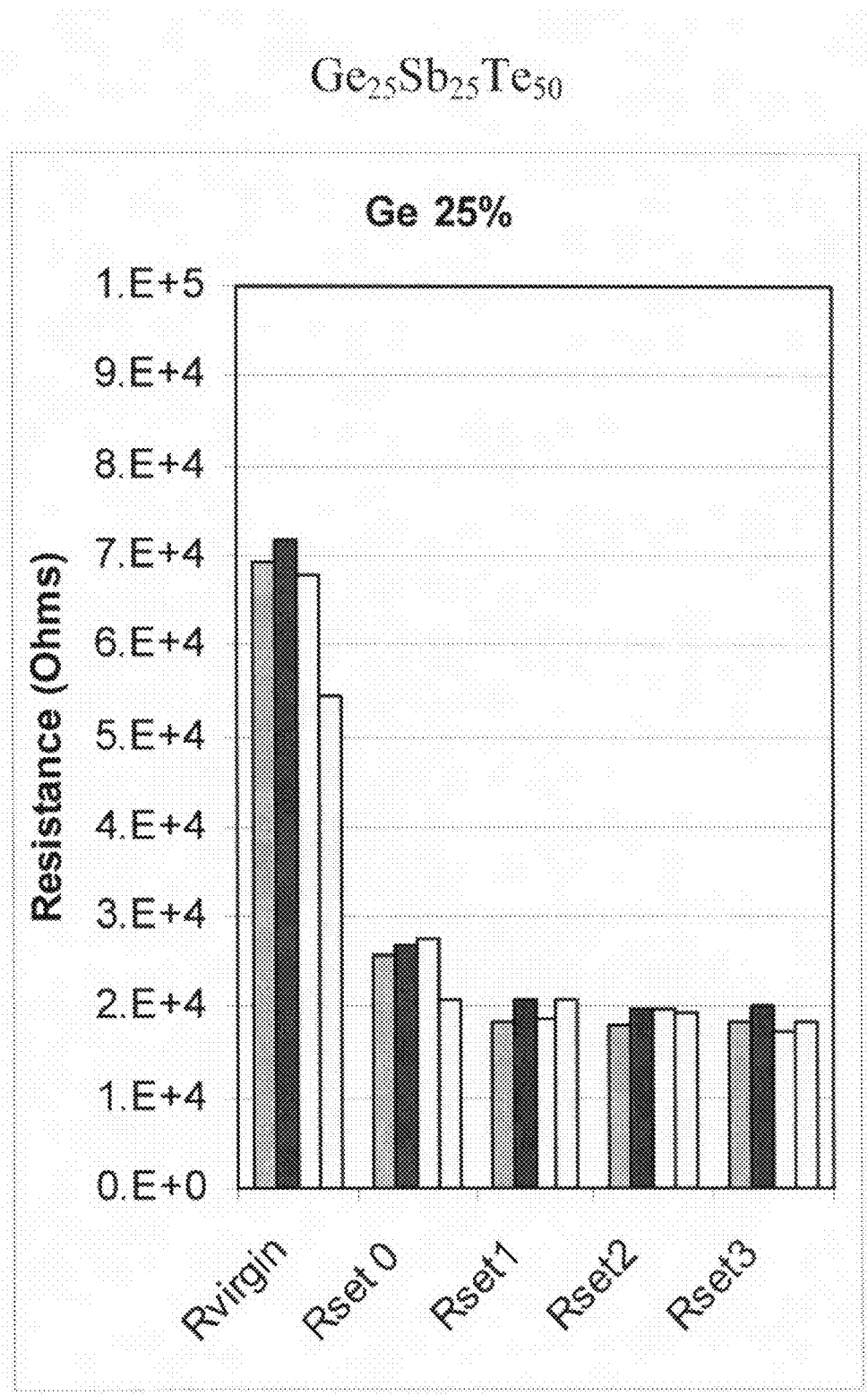
FIG. 7. Virgin resistance and set resistance upon cycling of a device that that includes $Ge_{25}Sb_{25}Te_{50}$ ($Ge_2Sb_2Te_4$) as the active chalcogenide material.

FIG. 7 shows the results for the device that includes Ge$_{25}$Sb$_{25}$Te$_{50}$ (Ge$_2$Sb$_2$Te$_4$) as the active chalcogenide material. This material includes 25% Ge, 25% Sb, and 50% Te. The results indicate that the step of setting the virgin state of the as-fabricated device leads to a significant reduction in the set resistance as Rset0 is much lower than Rvirgin. A smaller decrease in the set resistance is observed upon setting following a reset step to achieve Rset1 and subsequent cycles of reset-set lead to a stabilization of the set resistance. FIG. 7 indicates that stabilization of the set resistance of the device requires a formation process that includes at least one step in which the device is set and at least one step in which the device is reset. An as-fabricated device that includes Ge$_2$Sb$_2$Te$_4$ as the active chalcogenide material is not ready for use in its intended memory application since the stabilized set resistance deviates significantly from the virgin resistance and since conditioning of the device is necessary in order to stabilize its performance.

Figure 8:
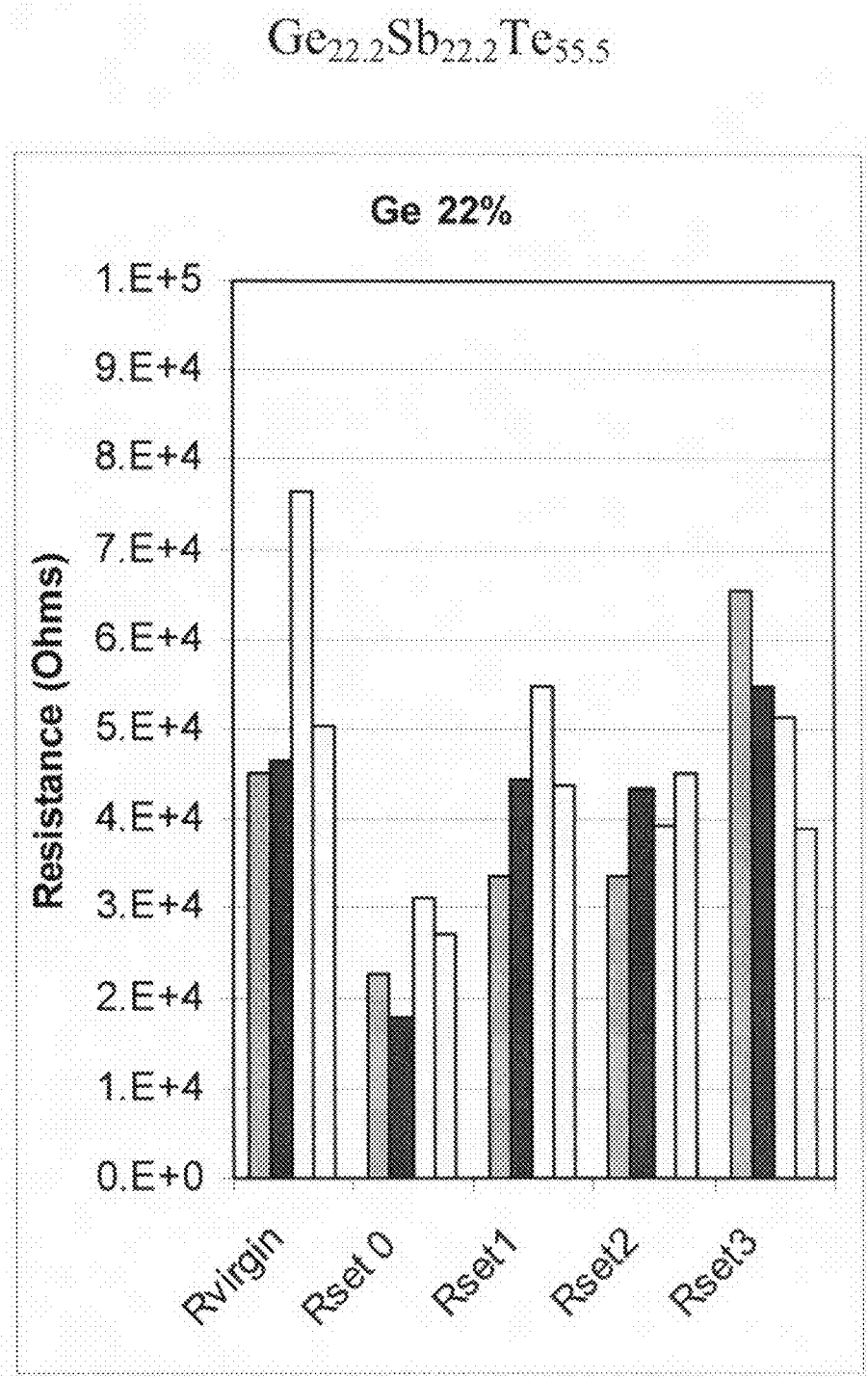
FIG. 8. Virgin resistance and set resistance upon cycling of a device that that includes $Ge_{22.2}Sb_{22.2}Te_{55.5}$ ($Ge_2Sb_2Te_5$) as the active chalcogenide material.

FIG. 8 shows the results for the device that includes Ge$_{22.2}$Sb$_{22.2}$Te$_{55.5}$ (Ge$_2$Sb$_2$Te$_5$) as the active chalcogenide material. This material includes 22.2% Ge, 22.2% Sb, and 55.5% Te. The results indicate that the step of setting the virgin state of the as-fabricated device leads to a significant reduction in the set resistance as Rset0 is much lower than Rvirgin. An increase in the set resistance is observed upon setting following a reset step to achieve Rset1 and subsequent cycles of reset-set lead to a stabilization of the set resistance. FIG. 8 indicates that stabilization of the set resistance of the device requires a formation process that includes at least one step in which the as-fabricated device is set and at least one step in which device is reset. Consequently, an as-fabricated device that includes Ge$_2$Sb$_2$Te$_5$ as the active chalcogenide material is not ready for use in its intended memory application since the stabilized set resistance deviates from the virgin resistance and a conditioning process that includes at least a set step and a reset step is necessary to stabilize the performance of the device.

Figure 9:
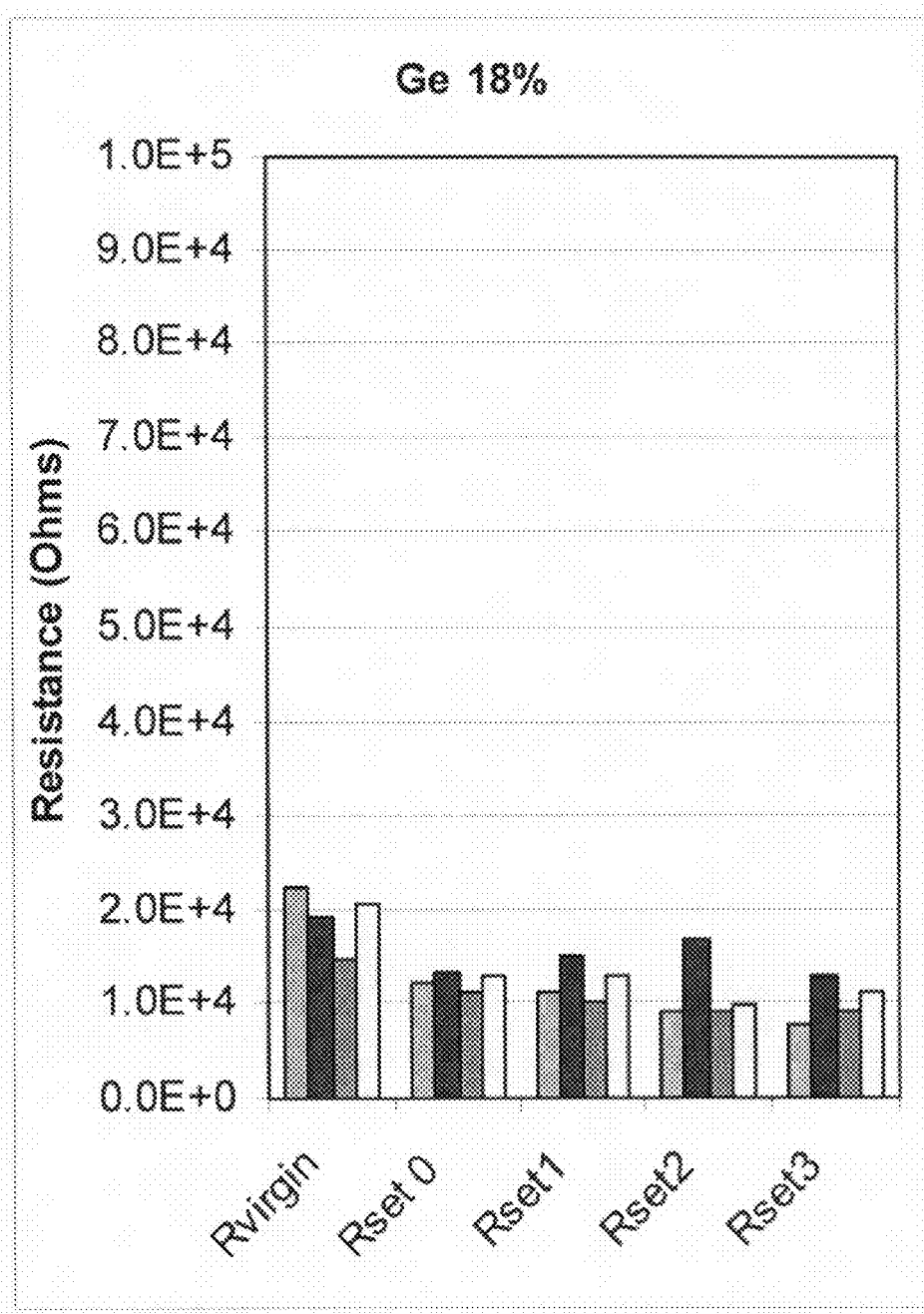
FIG. 9. Virgin resistance and set resistance upon cycling of a device that that includes $Ge_{17.8}Sb_{37.8}Te_{44.4}$ ($Ge_2Sb_4Te_5$) as the active chalcogenide material.

FIG. 9 shows the results for the device that includes Ge$_{17.8}$Sb$_{37.8}$Te$_{44.4}$ (approximate composition: Ge$_2$Sb$_4$Te$_5$) as the active chalcogenide material. This material includes 17.8% Ge, 37.8% Sb, and 44.4% Te. The results indicate that the step of setting the virgin state of the as-fabricated device leads to only a slight reduction in the set resistance as Rset0 is only slightly lower than Rvirgin. Subsequent cycles of reset-set show that Rset1 is similar to Rset0 and only slightly lower than Rvirgin. FIG. 9 indicates that stabilization of the set resistance of the device is nearly accomplished in the as-fabricated device and that a formation process is either not required or requires only the step of setting the device. Consequently, an as-fabricated device that includes Ge$_{17.8}$Sb$_{37.8}$Te$_{44.4}$ as the active chalcogenide material is ready or nearly ready for use in its intended memory application since the stabilized set resistance is similar to or deviates only slightly from the virgin resistance and little or no conditioning is necessary to stabilize the performance of the device.

Figure 10:
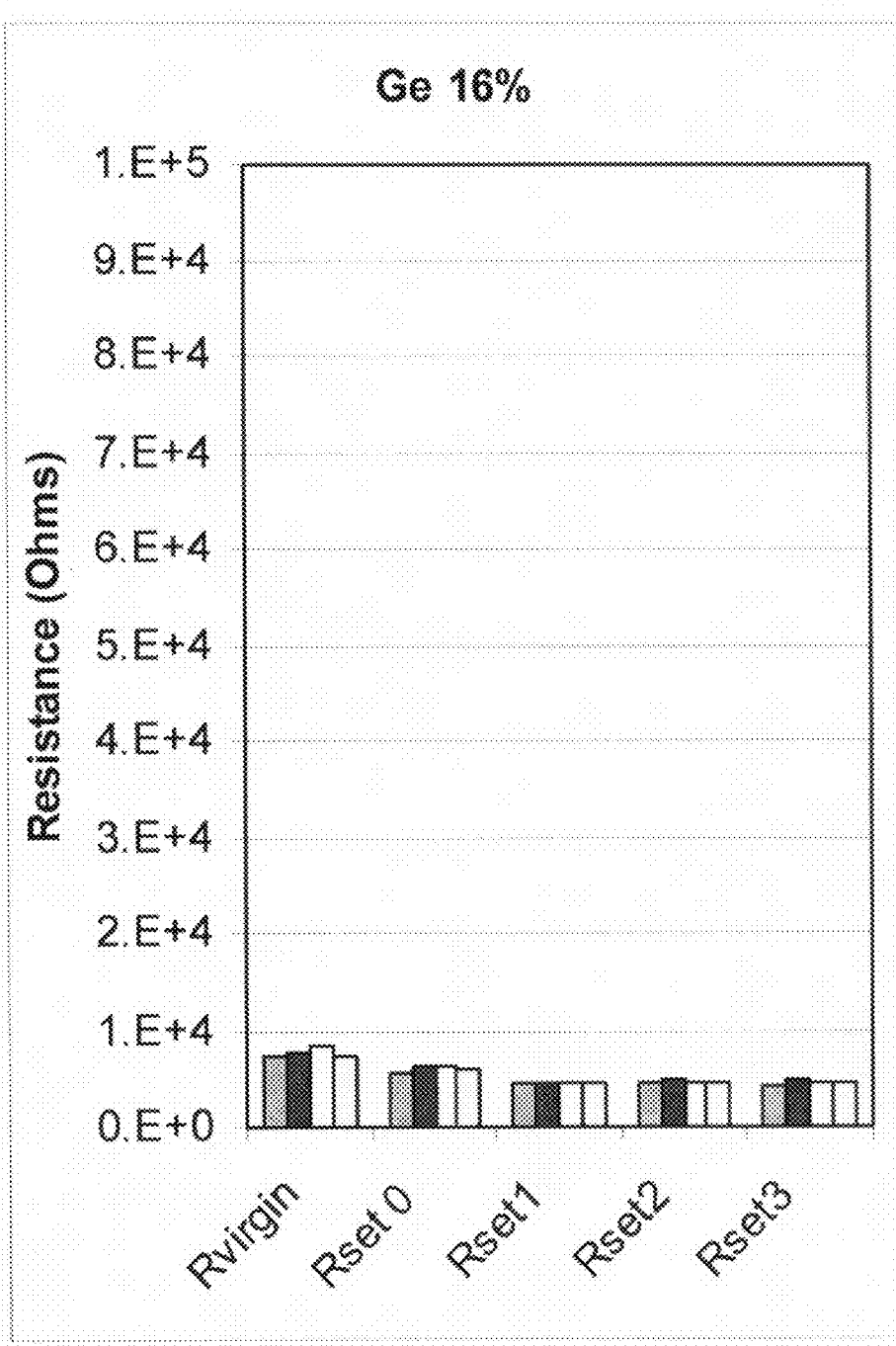
FIG. 10. Virgin resistance and set resistance upon cycling of a device that that includes $Ge_{15.5}Sb_{45.5}Te_{38.9}$ ($Ge_2Sb_5Te_4$) as the active chalcogenide material.

FIG. 10 shows the results for the device that includes Ge$_{15.5}$Sb$_{45.5}$Te$_{38.9}$ (approximate composition: Ge$_2$Sb$_5$Te$_4$) as the active chalcogenide material. This material includes 15.5% Ge, 45.5% Sb, and 38.9% Te. The results indicate that the step of setting the virgin state of the as-fabricated device leads to only a minimal reduction in the set resistance as Rset0 is very nearly the same as Rvirgin. Subsequent cycles of reset-set show that Rset1, Rset2, and Rset3 are similar to Rset0 and also only minimally different from Rvirgin. FIG. 10 indicates that stabilization of the set resistance of the device is accomplished or nearly accomplished in the as-fabricated device and that a formation process is essentially not required. Consequently, an as-fabricated device that includes $Ge_{15.5}Sb_{45.5}Te_{38.9}$ as the active chalcogenide material is basically ready for use in its intended memory application without conditioning or formation since the stabilized set resistance is very nearly the same as the virgin resistance.

Figure 11:
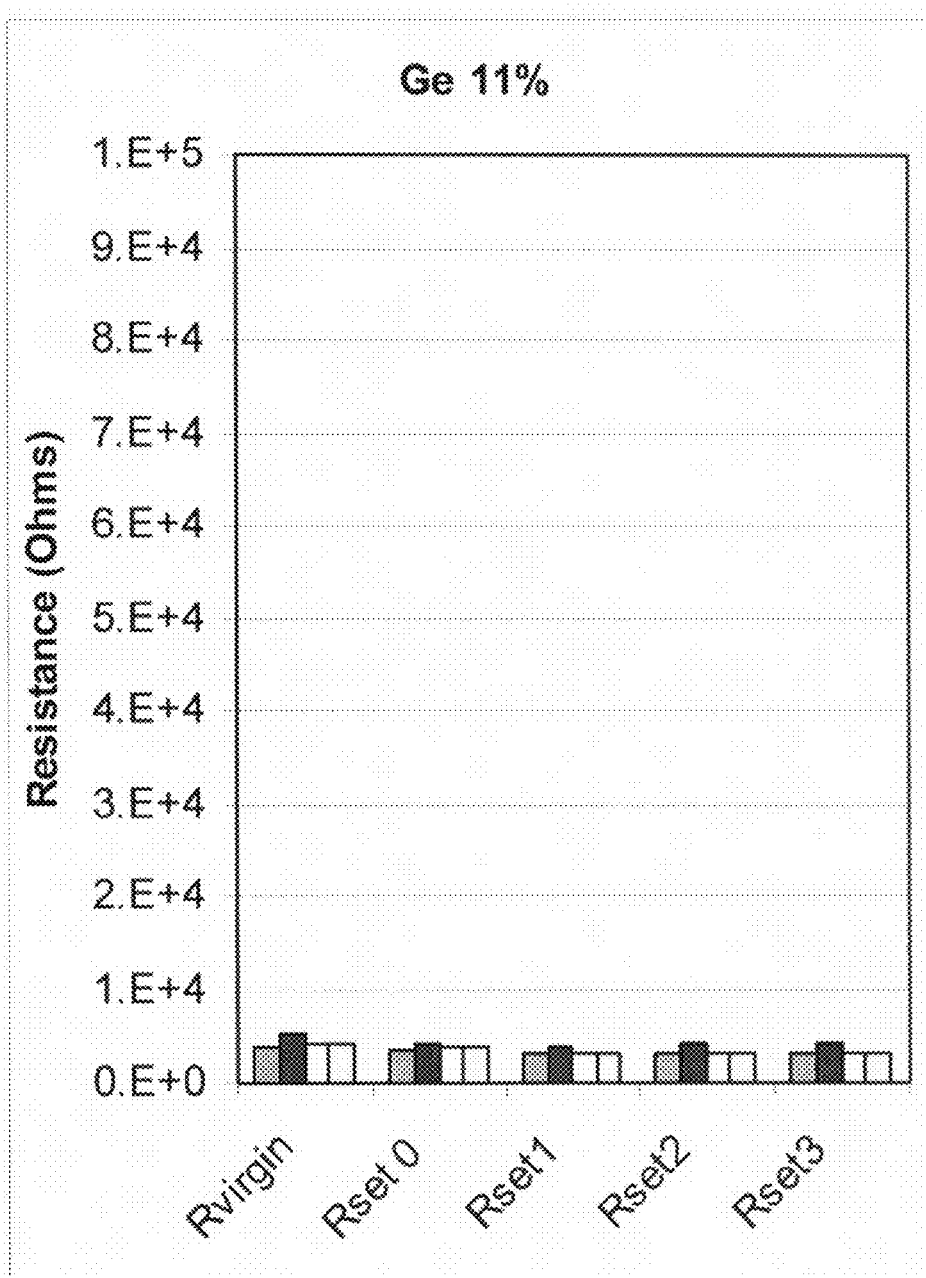
FIG. 11. Virgin resistance and set resistance upon cycling of a device that that includes $Ge_{11.1}Sb_{61.1}Te_{27.8}$ ($GeSb_6Te_3$) as the active chalcogenide material.

FIG. 11 shows the results for the device that includes $Ge_{11.1}Sb_{61.1}Te_{27.8}$ (approximate composition: $Ge_1Sb_6Te_3$) as the active chalcogenide material. This material includes 11.1% Ge, 61.1% Sb, and 27.8% Te. The results indicate that the step of setting the virgin state of the as-fabricated device leads to essentially no change in the set resistance as Rset0 is essentially the same as Rvirgin. Subsequent cycles of reset-set show that Rset1, Rset2, and Rset3 are also essentially the same as Rvirgin. FIG. 11 indicates that stabilization of the set resistance of the device is essentially accomplished in the as-fabricated device and that no formation process is required. Consequently, an as-fabricated device that includes $Ge_{11.1}Sb_{61.1}Te_{27.8}$ as the active chalcogenide material is ready for use in its intended memory application since the stabilized set resistance is similar to or deviates only slightly from the virgin resistance and little or no conditioning is necessary to stabilize the performance of the device.

The results of this example demonstrate that the number of steps required for the formation of devices that incorporate the instant chalcogenide alloys is reduced or eliminated. In one embodiment, formation of the device in its as-fabricated (virgin) state requires no more than one step of setting the device and one step of resetting the device. In a preferred embodiment, formation of the device in its as-fabricated (virgin) state requires no more than one step of setting the device. In a more preferred embodiment, no formation of the device in its as-fabricated (virgin) state is required.

In concert with the reduced or eliminated need for formation, the set resistance of the device stabilizes in a fewer number of cycles of setting and resetting such that the variation in the set resistance from cycle-to-cycle is reduced. In one embodiment, the resistance of the first set state of the device differs from the resistance of the virgin state of the device by less than 50%. In a preferred embodiment, the resistance of the first set state of the device differs from the resistance of the virgin state of the device by less than 25%. In another preferred embodiment, the resistance of the second set state of the device differs from the resistance of the first set state of the device by less than 25%. In a more preferred embodiment, the resistance of the first set state of the device differs from the resistance of the virgin state of the device by less than 15%. In another more preferred embodiment, the resistance of the second set state of the device differs from the resistance of the first set state of the device by less than 15%.

The results of this example support the conclusion that the need to form an as-fabricated chalcogenide memory diminishes and is eliminated as the Ge and/or Te concentration is reduced. The data indicate that formation characteristics are improved when the atomic concentration of Ge is less than or equal to 20%. In a preferred embodiment, the atomic concentration of Ge is less than or equal to 16%. In another preferred embodiment, the atomic concentration of Ge is less than or equal to 12%. The data indicate that improved formation characteristics are achieved when the atomic concentration of Te is less than or equal to 50%. In a preferred embodiment, the atomic concentration of Te is less than or equal to 40%. In another preferred embodiment, the atomic concentration of Te is less than or equal to 30%. The data indicate that a preferred Sb atomic concentration is at least 30%, a more preferred Sb atomic concentration is at least 40% and another preferred Sb atomic concentration is at least 50%.

EXAMPLE 3

In this example, the speed advantage of the instant devices is demonstrated. During operation of a memory device, it is necessary to program the device into and out of the set and reset states in most applications. Since establishment of the reset state can generally be accomplished on shorter time scales than establishment of the set state, the programming speed of the device is controlled by the time required for setting. (Typically, the time required to set (time-to-set) is a factor of 10 or more greater than the time to reset.) Since the time-to-set is governed by the underlying crystallization process, it is desirable to develop chalcogenide materials suitable for use in memory devices that exhibit fast crystallization so that the set speed of the device can be shortened. The devices used in this example correspond to those described in EXAMPLE 1 hereinabove; Devices included selected chalcogenide compositions from those presented in EXAMPLE 1 are described.

In this example, the time-to-set was measured by applying voltage pulses to a device in its reset state and determining the minimum pulse falltime required to transform the chalcogenide device to its set state. As described hereinabove, attainment of the set state from the reset state entails providing energy to the chalcogenide material. When a voltage pulse is applied, the energy supplied to the chalcogenide material increases as the time of exposure of the device to the pulse increases. The chalcogenide material accumulates the energy and responds through an increase in its crystalline volume fraction until the set state is achieved. The speed of operation of the device depends on the minimum time necessary to transform the device to its set state.

The time-to-set for devices containing several chalcogenide compositions was measured. Each device was first reset by applying a 2.5 V pulse having a duration of 20 ns. A set pulse also having an amplitude of 2.5 V was then applied. The set pulse had the following time characteristics: 10 ns risetime, 30 ns width, and variable falltime. The falltime was initially set at 199 ns and was systematically reduced to determine the minimum falltime required to transform the device into its set state. Upon conclusion of a set pulse with a particular falltime, the device resistance was measured to determine if the device was in its set state. If the device was found to be in its set state, it was reset with a reset pulse having an amplitude of 2.5 V and a duration of 20 ns and the experiment was repeated with a set pulse having a shorter falltime. The procedure was repeated until the minimum falltime needed to establish the set state was determined. (Set pulses having a falltime shorter than the minimum so-determined provide insufficient energy to set the device and lead to a device having a resistance that exceeds the set resistance.) The minimum falltime corresponds to a measure of the time required to set the device and may be referred to herein as the time-to-set the device.

Figure 12:
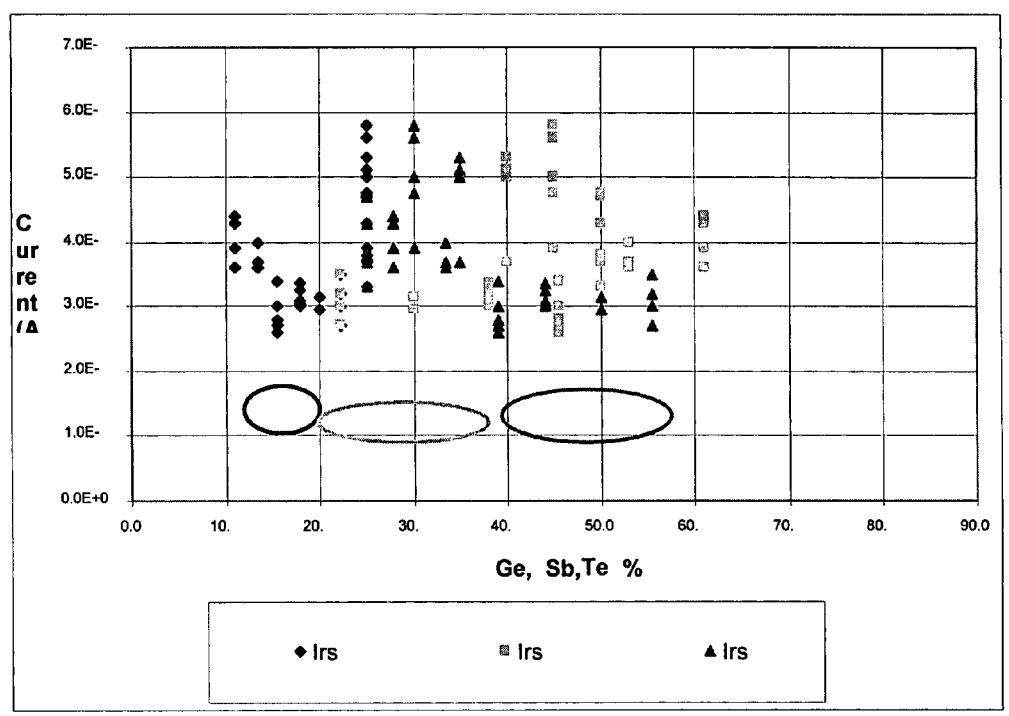
FIG. 12. Stabilized reset current of devices as a function of the atomic concentrations of Ge, Sb and Te present in the active chalcogenide material.

Results from the time-to-set measurements are shown in FIG. 12 and summarized in the following table, which shows the falltime determined for devices containing the active chalcogenide materials indicated.

| Chalcogenide Composition of Device | Time-to-Set (ns) |
|---|---|
| $Ge_{25}Sb_{25}Te_{50}$ | ~150 |
| $Ge_{22.2}Sb_{22.2}Te_{55.5}$ | ~150 |
| $Ge_{20}Sb_{30}Te_{50}$ | ~120 |
| $Ge_{17.8}Sb_{37.8}Te_{44.4}$ | ~60-75 |
| $Ge_{15.5}Sb_{45.5}Te_{39}$ | ~22-40 |
| $Ge_{11.1}Sb_{61.1}Te_{27.8}$ | ~25 |

The results indicate that the time-to-set of the device decreases as the Ge and/or Te composition of the active chalcogenide layer decreases. The time-to-set associated with the commonly employed $Ge_2Sb_2Te_5$ ($Ge_{22.2}Sb_{22.2}Te_{55.5}$) material is much longer than the time-to-set associated with any of the instant chalcogenide materials. The instant chalcogenide materials thus lead to faster operational speeds since a shorter time is needed to set the device.

In one embodiment, the Ge concentration of the chalcogenide material is less than or equal to 20%. In a preferred embodiment, the Ge concentration of the chalcogenide material is less than or equal to 18%. In a more preferred embodiment, the Ge concentration of the chalcogenide material is less than or equal to 16%. In another more preferred embodiment, the Ge concentration of the chalcogenide material is less than or equal to 13%.

In one embodiment, the Te concentration of the chalcogenide material is less than or equal to 50%. In a preferred embodiment, the Te concentration of the chalcogenide material is less than or equal to 45%. In a more preferred embodiment, the Te concentration of the chalcogenide material is less than or equal to 40%. In another more preferred embodiment, the Te concentration of the chalcogenide material is less than or equal to 30%. The data indicate that a preferred Sb atomic concentration is at least 30%, a more preferred Sb atomic concentration is at least 45% and another more preferred Sb atomic concentration is at least 60%.

In one embodiment, the time required to set a device including as an active layer a chalcogenide material according to the instant invention is less than or equal to 75% of the time required to set the same device when $Ge_{22.2}Sb_{22.2}Te_{55.5}$ is used as the active chalcogenide layer in the device. In this embodiment, the device configuration, volume and shape of active chalcogenide material, and electrical signal used to set are the same when an instant chalcogenide alloy is used as the active material as when $Ge_{22.2}Sb_{22.2}Te_{55.5}$ is used as the active chalcogenide material. In a preferred embodiment, the time required to set a device including as an active layer a chalcogenide material according to the instant invention is less than or equal to 50% of the time required to set the same device when $Ge_{22.2}Sb_{22.2}Te_{55.5}$ is used as the active chalcogenide layer. In this embodiment, the device configuration, volume and shape of active chalcogenide material, and electrical signal used to set are the same when an instant chalcogenide alloy is used as the active material as when $Ge_{22.2}Sb_{22.2}Te_{55.5}$ is used as the active chalcogenide material. In a more preferred embodiment, the time required to set a device including as an active layer a chalcogenide material according to the instant invention is less than or equal to 30% of the time required to set the same device when $Ge_{22.2}Sb_{22.2}Te_{55.5}$ is used as the active chalcogenide layer. In this embodiment, the device configuration, volume and shape of active chalcogenide material, and electrical signal used to set are the same when an instant chalcogenide alloy is used as the active material as when $Ge_{22.2}Sb_{22.2}Te_{55.5}$ is used as the active chalcogenide material.

EXAMPLE 4

In this example, the thermal stability characteristics of some of the memory devices described in EXAMPLE 1 hereinabove are described. As described hereinabove, elevation of temperature can lead to changes in the relative proportions of crystalline and amorphous phases in a volume of the active chalcogenide material, thus leading to an alteration of the memory state of a memory device and loss of information. Since a transformation of amorphous regions to a crystalline state can occur at a lower temperature than a transformation of crystalline regions to an amorphous state, thermal stability is best assessed in terms of a crystallization process.

In this example, we assess thermal stability in terms of the time required to transform a device from its reset state for several devices having different compositions of the active chalcogenide layer. This measure of thermal stability assesses the stability of information stored as the reset state to thermally induced setting due to a crystallization process. All measurements described in this example were performed on devices requiring no further formation.

In the thermal stability experiments of this EXAMPLE, each device was first reset, then heated to a particular temperature on a hot plate and finally, the resistance of the device was measured as a function of time at that temperature. The transition from the reset state to the set state was detected as a decrease in the resistance of the device as described hereinabove in connection with FIG. 1. In this EXAMPLE, the time required to transform the device from its reset state to its set state was selected to correspond to the time required for the resistance of the device, beginning in the reset state, to decrease to less than 10 kΩ. (For the purposes of this example, a resistance of less than 10 kΩ was selected to be sufficient to conclude that the device had been transformed to its set state.) The procedure was repeated for each device at several temperatures to determine the temperature dependence of the time required to transform the device from its reset state to its set state.

An Arrhenius plot of the transformation time as a function of $(kT)^{-1}$ (where k is Boltzmann's constant and T is absolute temperature in K) was prepared from the data. The thermal stability was assessed through a linear extrapolation of the transformation time from the times represented in the data set to a time of 10 years and determining the temperature associated with that time. This thermal stability metric is referred to herein as the ten-year data retention temperature and corresponds to the temperature at which data in the device can be maintained for 10 years without loss. When the temperature of the device is elevated above the ten-year data retention temperature, loss of information stored as the reset state occurs in less than 10 years and if the temperature of the device is reduced below the ten-year data retention temperature, the information is retained for more than 10 years.

The results of the thermal stability experiment of this EXAMPLE are summarized below:

| Device Chalcogenide | Ten-year Data Retention Temperature (° C.) |
|---|---|
| $Ge_{11.1}Sb_{61.1}Te_{27.8}$ | 95 |
| $Ge_{15.5}Sb_{45.5}Te_{38.9}$ | 145 |
| $Ge_{17.8}Sb_{37.8}Te_{44.4}$ | 135 |
| $Ge_{22.2}Sb_{22.2}Te_{55.5}$ | 115 |
| $Ge_{25}Sb_{25}Te_{50}$ | 85 |

In one embodiment, the ten-year data retention temperature is at least 120° C. In a preferred embodiment, the ten-year data retention temperature is at least 130° C. In a more preferred embodiment, the ten-year data retention temperature is at least 140° C.

The thermal stability data show that the ten-year data retention temperature initially increases as the Ge atomic concentration is reduced below the amount present in the conventional $Ge_2Sb_2Te_5$ alloy composition commonly used in current devices and then decreases. The data retention improves as the Ge atomic concentration is reduced to ~18% and then to ~16%. At ~11% Ge, however, the data retention characteristics degrade and thermally induced setting of information occurs at lower temperatures. The data indicate that a preferred Ge atomic concentration is in the range of 13%-19%, a more preferred Ge atomic concentration is in the range of 14%-18%, and a most preferred Ge atomic concentration is in the range of 15%-17%. The data indicate that a preferred Te atomic concentration is in the range of 27-56%, a more preferred Te atomic concentration is in the range of 32-51%, and a most preferred Te atomic concentration is in the range of 37%-46%. The data indicate that a preferred Sb atomic concentration is at least 30%, a more preferred Sb atomic concentration is at least 45% and a most preferred Sb atomic concentration is at least 60%.

EXAMPLE 5

In this example, the reset current characteristics of some of the memory devices described in EXAMPLE 1 hereinabove are described. This example specifically demonstrates differences in the reproducibility of the reset current for devices that include active chalcogenide materials of different compositions. More particularly, this example demonstrates trends in the reproducibility of the reset current with the atomic concentration of different elements contained within the chalcogenide material.

The reset current described in this example is the current required to transform the device to its reset state. Illustrative resistance as a function of current plots for selected devices were presented and described in FIGS. 1-5 hereinabove. The reset currents presented in this example correspond to the reset current required to form the reset state of the device after the device characteristics have stabilized and any transient or formation effects associated with the devices have been ameliorated by an appropriate number of cycles of setting and resetting the devices as described hereinabove.

The reset currents of several devices are summarized in FIG. 12. The results are presented in the form of reset current as a function of the elemental composition of the active chalcogenide material of the device. Reset currents are plotted separately as a function of the atomic composition of each element of the active chalcogenide material. The reset current of each device is plotted separately as a function of the atomic compositions of Ge, Sb, and Te present in the active chalcogenide material of the device so that three points appear in FIG. 12 for each device. The reset current for several different devices having each of the distinct chalcogenide compositions was measured and is presented in FIG. 12 to illustrate the reproducibility of reset current for different devices having the same chalcogenide composition.

In FIG. 12, reset current is plotted as a function of the atomic percentages of Ge, Sb and Te in the active chalcogenide composition using diamond symbols, square symbols, and triangle symbols, respectively. Also included are three ovals that designate the preferred atomic percentage of each element within the active chalcogenide material. The range of preferred composition for each element in the context of this example is based on the consistency of the reset current observed over the range for several devices.

The left oval depicts the preferred range of Ge atomic composition and extends from about 11.5% to about 20%. In this range of Ge compositions, the reproducibility of the reset current from device-to-device is high as the reset currents of different devices that include Ge compositions within this range are similar and thus show consistent performance. The spread of reset currents for compositions within the range depicted by the oval is generally less than for compositions outside the range depicted by the oval. The spread in the reset current at an atomic composition of Ge of 25%, for example, is much greater than at atomic compositions of Ge within the Ge oval.

The middle oval depicts the preferred range of Sb atomic composition and extends from about 19.5% to about 38%. In this range of Sb compositions, the reproducibility of the reset current from device-to-device is high as the reset currents of different devices that include Sb compositions within this range are similar and thus show consistent performance. The spread of reset currents for compositions within the range depicted by the oval is generally less than for compositions outside the range depicted by the oval. The spread in the reset current at an atomic composition of Sb of 30%, for example, is much lower than at atomic compositions of Ge (e.g 45%) outside the Sb oval.

The right oval depicts the preferred range of Te atomic composition and extends from about 39% to about 57.5%. In this range of Te compositions, the reproducibility of the reset current from device-to-device is high as the reset currents of different devices that include Te compositions within this range are similar and thus show consistent performance. The spread of reset currents for compositions within the range depicted by the oval is generally less than for compositions outside the range depicted by the oval. The spread in the reset current at an atomic composition of Te of 30%, for example, is much greater than at atomic compositions of Te within the Te oval.

Variations in the reset current provide a measure of the stability and consistency of performance of different chalcogenide materials in a typical two-terminal device structure. Compositions that show reproducible and consistent reset currents over different devices are indicative of more stable intrinsic behavior of the chalcogenide. These compositions may provide advantages in array structures containing a large number of devices where consistency of performance across the array of devices is desired.

The instant invention provides chalcogenide materials and devices containing same that provide benefits in terms of device performance factors that include a reduction in the need for electrical device formation and/or faster operation by virtue of a shorter time-to-set and/or longer data retention times by virtue of improved thermal stability. While the optimal atomic concentrations may vary slightly depending on the particular performance factor of interest, the instant chalcogenide materials generally include Ge and Sb where the atomic concentration of Ge is less than or equal to 20% and the atomic concentration of Sb is greater than or equal to 30%. In a preferred embodiment, the atomic concentration of Ge is less than or equal to 16% and the atomic concentration of Sb is greater than or equal to 40%. In a more preferred embodiment, the atomic concentration of Ge is less than or equal to 12% and the atomic concentration of Sb is greater than or equal to 50%.

In other embodiments, the instant chalcogenide material includes Ge and Sb as described above and further includes Te. In a preferred embodiment, the atomic concentration of Te is less than or equal to 50% and preferably between 20% and 50%. In another preferred embodiment, the atomic concentration of Te is less than or equal to 40% and preferably between 30% and 40%. In still another preferred embodiment, the atomic concentration of Te is less than or equal to 30%.

Preferred chalcogenide compositions may differ depending on the property or combinations of properties of the chalcogenide material or device containing same that one wishes to emphasize or design for. Relevant device properties include the speed, reset current, reset resistance, virgin resistance and holding voltage. In another embodiment of the instant invention, suitable characteristics can be obtained when the atomic concentration of Ge is between 15% and 20% and the atomic concentration of Te is between 39% and 42%.

The instant invention further includes embodiments having functional equivalents to the illustrative embodiments described hereinabove. As described in several of the U.S. Patents incorporated by reference hereinabove, chalcogenide materials generally include a chalcogen element and one or more chemical or structural modifying elements. The chalcogen element (e.g. Te, Se) is selected from column VI of the periodic table and the modifying elements can be selected from column III (e.g. Ga, Al, In), column IV (e.g. Si, Ge, Sn), or column V (e.g. P, As, Sb) of the periodic table. The role of modifying elements includes providing points of branching or crosslinking between chains comprising the chalcogen element. Column IV modifiers can function as tetracoordinate modifiers that include two coordinate positions within a chalcogenide chain and two coordination positions that permit branching or crosslinking away from the chalcogenide chain. Column III and V modifiers can function as tricoordinate modifiers that include two coordinate positions within a chalcogenide chain and one coordinate position that permits branching or crosslinking away from the chalcogenide chain. Although the embodiments described hereinabove have illustrated the features of the instant invention using chalcogenide materials that include Ge, Sb, and/or Te, it is to be understood by those of skill in the art that Ge may be substituted in whole or in part with another column IV element (e.g. Si), Sb may be substituted in whole or in part with another column V element (e.g. As), and Te may be substituted in whole or in part with another column VI element (e.g. Se).

In addition to individual devices, the instant invention further extends to arrays of devices. The instant chalcogenide materials and devices can be integrated into arrays, including X-Y arrays, such as those described in U.S. Pat. Nos. 5,694, 146; 5,912,839; and 6,141,241; the disclosures of which are hereby incorporated by reference. Chalcogenide device arrays may be used for both memory and processing capabilities; including logic and parallel computing.

The foregoing discussion and description are not meant to be limitations upon the practice of the present invention, but rather illustrative thereof. It is to be appreciated by persons of skill in the art that numerous equivalents of the illustrative embodiments disclosed herein exist. It is the following claims, including all equivalents and obvious variations thereof, in combination with the foregoing disclosure which define the scope of the invention.

We claim:

1. An electrical device comprising
a chalcogenide material, said chalcogenide material comprising Ge, Sb, and Te; said Ge having an atomic concentration between 11% and 18%, said Sb having an atomic concentration between 37% and 61.1%, and said Te having an atomic concentration between 27% and 45%;
a first electrode in electrical communication with said chalcogenide material; and
a second electrode in electrical communication with said chalcogenide material, said device having: a virgin state, a first set state formed by setting said virgin state, a first reset state formed by resetting said first set state, a second set state formed by setting said first reset state, a second reset state formed by resetting said second set state, and a third set state formed by setting said second reset state,
wherein the resistance of said first set state differs from the resistance of said virgin state by less than 50%.

2. The electrical device of claim 1, wherein the resistance of said first set state differs from the resistance of said virgin state by less than 25%.

3. The electrical device of claim 1, wherein the resistance of said first set state differs from the resistance of said virgin state by less than 15%.

4. The electrical device of claim 1, wherein the resistance of said second set state differs from the resistance of said first set state by less than 25%.

5. The electrical device of claim 4, wherein the resistance of said third set state differs from the resistance of said second set state by less than 15%.

6. The electrical device of claim 1, wherein the resistance of said second set state differs from the resistance of said first set state by less than 15%.

7. The electrical device of claim 1, wherein the atomic concentration of said Ge is between 15% and 18%.

8. The electrical device of claim 1, wherein the atomic concentration of said Sb is between 37% and 46%.

9. The electrical device of claim 1, wherein the atomic concentration of said Te is between 38% and 45%.

* * * * *